US00RE45989E

(19) United States
(12) Reissued Patent
Morita et al.

(10) Patent Number: US RE45,989 E
(45) Date of Reissued Patent: Apr. 26, 2016

(54) SEMICONDUCTOR DEVICE AND METHOD FOR DRIVING THE SAME

(71) Applicant: PANASONIC CORPORATION, Osaka (JP)

(72) Inventors: Tatsuo Morita, Kyoto (JP); Manabu Yanagihara, Osaka (JP); Hidetoshi Ishida, Osaka (JP); Yasuhiro Uemoto, Toyama (JP); Hiroaki Ueno, Osaka (JP); Tsuyoshi Tanaka, Osaka (JP); Daisuke Ueda, Osaka (JP)

(73) Assignee: PANASONIC CORPORATION, Osaka (JP)

(21) Appl. No.: 14/301,066

(22) Filed: Jun. 10, 2014

Related U.S. Patent Documents

Reissue of:

(64) Patent No.: 8,203,376
Issued: Jun. 19, 2012
Appl. No.: 12/445,390
PCT Filed: Nov. 20, 2007
PCT No.: PCT/JP2007/072476
§ 371 (c)(1),
(2) Date: Apr. 13, 2009
PCT Pub. No.: WO2008/062800
PCT Pub. Date: May 29, 2008

(30) Foreign Application Priority Data

Nov. 20, 2006 (JP) ..... 2006-312502
Dec. 12, 2006 (JP) ..... 2006-334094
Jun. 8, 2007 (JP) ..... 2007-153031

(51) Int. Cl.
*H03K 17/687* (2006.01)
*H01L 29/778* (2006.01)
*H01L 27/06* (2006.01)

(52) U.S. Cl.
CPC ..... *H01L 29/7787* (2013.01); *H01L 27/0605* (2013.01)

(58) Field of Classification Search
CPC ..... H01L 29/0605; H01L 29/7787; H01L 29/1066; H01L 29/8124; H01L 29/43; H01L 27/1237; H01L 27/1214
USPC ..... 327/427; 257/57, E21.413
See application file for complete search history.

(56) References Cited

U.S. PATENT DOCUMENTS 4,903,091 A 2/1990 Baba et al.
5,111,256 A 5/1992 Ohata et al.

(Continued)

FOREIGN PATENT DOCUMENTS

EP 1 128 443 A1 8/2001
JP 52-072185 6/1977

(Continued)

OTHER PUBLICATIONS

Notice of Allowance issued in U.S. Appl. No. 12/445,390 with Date Mailed Mar. 5, 2012.

(Continued)

*Primary Examiner* — Linh M Nguyen
(74) *Attorney, Agent, or Firm* — McDermott Will & Emery LLP

(57) ABSTRACT

A semiconductor device includes a semiconductor layer stack 13 formed on a substrate 11 and having a channel region, a first electrode 16A and a second electrode 16B formed spaced apart from each other on the semiconductor layer stack 13, a first gate electrode 18A formed between the first electrode 16A and the second electrode 16B, and a second gate electrode 18B formed between the first gate electrode 18A and the second electrode 16B. A first control layer 19A having a p-type conductivity is formed between the semiconductor layer stack 13 and the first gate electrode 18A.

84 Claims, 23 Drawing Sheets

(56) References Cited

U.S. PATENT DOCUMENTS

| | | | | |
|---|---|---|---|---|
| 6,111,273 | A | 8/2000 | Kawai | |
| 6,306,693 | B1 * | 10/2001 | Ishiguro et al. | H01L 27/1214 257/E21.413 |
| 6,586,766 | B2 * | 7/2003 | Yamazaki | H01L 27/1237 257/57 |
| 6,600,192 | B1 | 7/2003 | Sugawara et al. | |
| 7,038,252 | B2 | 5/2006 | Saito et al. | |
| 7,576,373 | B1 | 8/2009 | Hikita et al. | |
| 7,595,680 | B2 * | 9/2009 | Morita et al. | 327/427 |
| 7,852,137 | B2 * | 12/2010 | Machida et al. | 327/427 |
| 7,982,240 | B2 * | 7/2011 | Machida | 257/133 |
| 2002/0017648 | A1 | 2/2002 | Kasahara et al. | |
| 2002/0024057 | A1 | 2/2002 | Inokuchi et al. | |
| 2005/0189559 | A1 | 9/2005 | Saito et al. | |
| 2005/0189561 | A1 * | 9/2005 | Kinzer et al. | 257/192 |
| 2006/0033480 | A1 | 2/2006 | Soldano | |
| 2006/0060871 | A1 | 3/2006 | Beach | |
| 2006/0062032 | A1 | 3/2006 | Soldano | |
| 2006/0145746 | A1 * | 7/2006 | Metzler | 327/427 |
| 2006/0273347 | A1 | 12/2006 | Hikita et al. | |
| 2007/0102727 | A1 | 5/2007 | Twynam | |
| 2007/0131968 | A1 | 6/2007 | Morita et al. | |
| 2009/0121775 | A1 | 5/2009 | Ueda et al. | |
| 2009/0154210 | A1 | 6/2009 | Fujikawa | |

FOREIGN PATENT DOCUMENTS

| | | | |
|---|---|---|---|
| JP | 52-072185 | A | 6/1977 |
| JP | 61-230379 | A | 10/1986 |
| JP | 2-254762 | | 10/1990 |
| JP | 02-254762 | A | 10/1990 |
| JP | 4-80957 | A | 3/1992 |
| JP | 9-199452 | A | 7/1997 |
| JP | 11-261053 | | 9/1999 |
| JP | 11-261053 | A | 9/1999 |
| JP | 2000-349095 | A | 12/2000 |
| JP | 2003-059946 | A | 2/2003 |
| JP | 2003-228320 | | 8/2003 |
| JP | 2003-228320 | A | 8/2003 |
| JP | 2004-273486 | | 9/2004 |
| JP | 2004-273486 | A | 9/2004 |
| WO | 2005/070007 | A2 | 8/2005 |
| WO | 2005/070009 | A2 | 8/2005 |
| WO | 2005/079370 | A2 | 9/2005 |
| WO | 2006/020921 | A2 | 2/2006 |
| WO | 2006/061942 | A1 | 6/2006 |

OTHER PUBLICATIONS

European Search Report issued in European Patent Application No. 07832206.2-2203, mailed Nov. 19, 2010.

* cited by examiner

SEMICONDUCTOR DEVICE AND METHOD FOR DRIVING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATIONS

This application *is a reissue application of U.S. Pat. No. 8,203,376 issued on Jun. 19, 2012 issued from U.S. patent application Ser. No. 12/445,390 filed on Apr. 13, 2009, which* is the U.S. National Phase under 35 U.S.C. §371 of International Application No. PCT/JP2007/072476, filed on Nov. 20, 2007, which in turn claims the benefit of Japanese Application Nos. 2006-312502, filed on Nov. 20, 2006, 2006-334094, filed on Dec. 12, 2006, and 2007-153031, filed on Jun. 8, 2007, the disclosures of which Applications are incorporated by reference herein.

TECHNICAL FIELD

The present invention relates to a semiconductor device, and more particularly to a semiconductor device capable of a bidirectional switching operation used for power control, and a method for driving the same.

BACKGROUND ART

In recent years, field effect transistors (FETs) using a nitride semiconductor such as gallium nitride (GaN) have been widely researched as power switching devices. Since GaN can form various compound materials with aluminum nitride (AlN) and indium nitride (InN), nitride semiconductors can form heterojunctions as do arsenic-based semiconductors such as gallium arsenide (GaAs). Therefore, they can be used for forming heterojunction field effect transistors (HFETs) with heterojunctions.

For most of devices currently used in the field of power electronics, normally-off type devices are strongly desired for ensuring safety in the event of a failure. However, even if a nitride semiconductor is undoped, spontaneous polarization and piezoelectric polarization produce a high concentration of carriers at the heterojunction interface. Therefore, when an FET is produced by using a nitride semiconductor, it is likely to be of the depression type (normally-on type), and it is difficult to obtain characteristics of the enhancement type (normally-off type) (see, for example, Patent Document 1).

Structures of normally-off type FETs using nitride semiconductors include, but not limited to: a structure in which the thickness and/or the Al composition ratio of an AlGaN layer being the barrier layer in the AlGaN/GaN heterojunction is reduced; a structure in which a recessed portion is provided in the gate portion to thereby shift the threshold voltage in the positive direction; a structure in which an FET is produced on the (10-12) plane of a sapphire substrate to prevent a polarization electric field from being generated in the crystal growth direction of the nitride semiconductor.

Junction field effect transistors (JFETs) having a p-type GaN layer formed in a gate portion have also been proposed (see, for example, Patent Document 2). A JFET employs, for the gate thereof, a pn junction having a larger built-in potential than that of a Schottky junction. Therefore, the gate turn- ON voltage can be increased, and the gate leakage current can be suppressed even when a positive gate voltage is applied.

Moreover, in the field of power electronics, there is a demand for a bidirectional switch capable of bidirectional current control, and a bidirectional switch using a GaN semiconductor has been proposed. (Patent Document 3)

Patent Document 1: Japanese Laid-Open Patent Publication No. 2004-273486

Patent Document 2: Japanese Laid-Open Patent Publication No. 2003-228320

Patent Document 3: United States Patent Application Publication No. 2005/189561

DISCLOSURE OF THE INVENTION

Problems to be Solved by the Invention

However, the following problem will be encountered when one attempts to realize a bidirectional switching operation required for power control, or the like, by using a normally-off type FET using a conventional nitride semiconductor as described above. The bidirectional switching operation as used herein refers to a switching operation with which a current can be conducted in at least one direction and with which the current can be blocked in both directions.

First, since a conventional FET has a small breakdown voltage (reverse voltage) to a negative bias; a bidirectional switch product capable of conducting and blocking a current cannot be realized unless a plurality of elements are combined together. Moreover, where operated as a bidirectional switch, control from external equipment will be complicated. Moreover, it is difficult to realize a control in four quadrants and to operate it as a diode, i.e., a reverse-blocking switch.

A conventional normally-off type FET has a narrow margin for the voltage that can be applied to the gate electrode. Therefore, a gate voltage higher than about 1 V cannot be applied, and an erroneous operation may therefore occur due to noise.

It is an object of the present invention to solve the problems in the prior art and to realize a semiconductor device which has excellent reverse voltage characteristics, which as a single element constitutes a bidirectional switch product, and which allows for the application of a high gate voltage.

Means for Solving the Problems

Specifically, a semiconductor device of the present invention includes: a semiconductor layer stack formed on a substrate and having a channel region; a first electrode and a second electrode formed spaced apart from each other on the semiconductor layer stack; a first gate electrode formed between, and spaced apart from, the first electrode and the second electrode, and a second gate electrode formed between the first gate electrode and the second electrode; and a first control layer having a p-type conductivity formed between the semiconductor layer stack and the first gate electrode.

The semiconductor device of the present invention includes the first control layer having a p-type conductivity. Therefore, it is possible to inject holes into the channel region by applying a forward bias from the first gate electrode to the channel region. Since the holes injected into the channel region act like donor ions, the carrier concentration can be modulated in the channel region. As a result, it is possible to realize a normally-off type nitride semiconductor transistor having a large operating current.

In a semiconductor device of the present invention, the semiconductor device has a mode of operation in which a positive voltage with reference to a potential of the first electrode is applied to the first gate electrode to thereby inject holes into the channel region.

In a semiconductor device of the present invention, a threshold voltage of the first gate electrode and that of the second gate electrode are different from each other.

In a semiconductor device of the present invention, the second gate electrode is in a Schottky junction with the semiconductor layer stack.

In a semiconductor device of the present invention, the semiconductor layer stack includes a depressed portion; and the second gate electrode is in contact with a bottom surface of the depressed portion.

A semiconductor device of the present invention further includes a second control layer having a p-type conductivity formed between the semiconductor layer stack and the second gate electrode.

In a semiconductor device of the present invention, an uppermost layer of the semiconductor layer stack includes a first portion, and a second portion having a thickness smaller than that of the first portion; and the first control layer and the second control layer are formed on the first portion.

In a semiconductor device of the present invention, the first portion surrounds a third portion having a thickness less than or equal to that of the second portion; and the first control layer and the second control layer is formed on the first portion and the third portion.

In a semiconductor device of the present invention, the semiconductor layer stack includes a first semiconductor layer, a second semiconductor layer having a bandgap larger than that of the first semiconductor layer, and an etching absorbing layer having a bandgap smaller than that of the second semiconductor layer, wherein the layers are formed in this order from bottom; and the etching absorbing layer is the uppermost layer of the semiconductor layer stack.

In a semiconductor device of the present invention, the first control layer and the second control layer have a protruding portion.

A semiconductor device of the present invention further includes a high resistance layer formed on the semiconductor layer stack in a region between the first control layer and the second control layer, the high resistance layer having a resistance higher than that of the first control layer and the second control layer.

In a semiconductor device of the present invention, the high resistance layer is of a gallium oxide or is a layer containing boron ions.

A semiconductor device of the present invention further includes an undoped semiconductor layer formed on the semiconductor layer stack, wherein the first control layer and the second control layer are p-type impurity-diffused regions selectively formed in the undoped semiconductor layer.

A semiconductor device of the present invention further includes an oxide film layer having an opening formed on the semiconductor layer stack, wherein the first control layer and the second control layer are formed so as to be in contact with the semiconductor layer stack exposed through the opening.

In a semiconductor device of the present invention, an interval between the first gate electrode and the second gate electrode is larger than that between the first electrode and the first gate electrode, and is larger than that between the second electrode and the second gate electrode.

In a semiconductor device of the present invention, the semiconductor device has a mode of operation in which a voltage greater than or equal to a built-in potential of a pn junction formed by the first control layer and the semiconductor layer stack is applied between the first gate electrode and the first electrode.

In a semiconductor device of the present invention, a potential greater than a threshold voltage of the first gate electrode with reference to a potential of the first electrode is applied to the first gate electrode and a potential less than or equal to a threshold voltage of the second gate electrode with reference to a potential of the second electrode is applied to the second gate electrode, whereby the semiconductor device is brought to a reverse-blocking state in which a current flows from the second electrode to the first electrode but not from the first electrode to the second electrode; and a potential less than or equal to the threshold voltage of the first gate electrode is applied to the first gate electrode with respect to the potential of the first electrode and a potential less than or equal to the threshold voltage of the second gate electrode is applied to the second gate electrode with respect to the potential of the second electrode, whereby the semiconductor device is brought to a non-conductive state in which a current does not flow in either direction between the first electrode and the second electrode.

In a semiconductor device of the present invention, the second electrode and the second gate electrode are electrically shorted with each other.

In a semiconductor device of the present invention, a potential greater than the threshold voltage of the first gate electrode with reference to the potential of the first electrode is applied to the first gate electrode and a potential greater than the threshold voltage of the second gate electrode with reference to the potential of the second electrode is applied to the second gate electrode, whereby the semiconductor device is brought to a conductive state in which a current flows in both directions between the first electrode and the second electrode; and a potential less than or equal to the threshold voltage of the first gate electrode is applied to the first gate electrode with respect to the potential of the first electrode and a potential less than or equal to the threshold voltage of the second gate electrode is applied to the second gate electrode with respect to the potential of the second electrode, whereby the semiconductor device is brought to a non-conductive state in which a current does not flow in either direction between the first electrode and the second electrode.

A semiconductor device of the present invention further includes a third control layer having a p-type conductivity formed on the semiconductor layer stack and spaced apart from the first control layer, wherein the second gate electrode and the second electrode are formed integrally on the third control layer.

In a semiconductor device of the present invention, the semiconductor layer stack includes a first semiconductor layer and a second semiconductor layer which are layered in this order from a side of the substrate; the second semiconductor layer has a bandgap larger than that of the first semiconductor layer; and the channel region is an interface region between the first semiconductor layer and the second semiconductor layer.

In a semiconductor device of the present invention, the semiconductor layer stack is of a nitride semiconductor or a silicon carbide semiconductor.

In a semiconductor device of the present invention, the nitride semiconductor contains at least one of gallium nitride and aluminum gallium nitride.

A semiconductor device of the present invention further includes a control section for controlling a voltage applied to the first gate electrode and second gate electrode, wherein: in a conductive state in which a current flows in both directions between the first electrode and the second electrode, the control section applies, to the first gate electrode, a voltage higher than a threshold voltage of the first gate electrode with respect to a potential of the first electrode, and applies, to the second gate electrode, a voltage higher than a threshold voltage of the second gate electrode with reference to a potential of the second electrode; in a non-conductive state in which a current does not flow in either direction between the first electrode and the second electrode, the control section applies, to the first gate electrode, a voltage less than or equal to the threshold voltage of the first gate electrode with reference to the potential of the first electrode, and applies, to the second gate electrode, a voltage less than or equal to the threshold voltage of the second gate electrode with reference to the potential of the second electrode.

In a semiconductor device of the present invention, the control section includes: a first power supply for applying a voltage between the first electrode and the first gate electrode; and a second power supply for applying a voltage between the second electrode and the second gate electrode.

In a semiconductor device of the present invention, an output voltage of the first power supply and that of the second power supply are equal to each other.

In a semiconductor device of the present invention, the first power supply and the second power supply are each a variable power supply capable of varying the output voltage thereof.

In a semiconductor device of the present invention, the control section includes: a first control terminal receiving a first control signal for controlling a voltage applied to the first gate electrode; a second control terminal receiving a second control signal for controlling a voltage applied to the second gate electrode; a first gate driving circuit driven by the first control signal for switching between a first state in which a voltage higher than the threshold voltage of the first gate electrode is applied between the first electrode and the first gate electrode, and a second state in which a voltage less than or equal to the threshold voltage of the first gate electrode is applied between the first electrode and the gate electrode; and a second gate driving circuit driven by the second control signal for switching between a third state in which a voltage higher than the threshold voltage of the second gate electrode is applied between the second electrode and the second gate electrode, and a fourth state in which a voltage less than or equal to the threshold voltage of the second gate electrode is applied between the second electrode and the second gate electrode, wherein: in the conductive state, the first gate driving circuit is set to the first state and the second gate driving circuit is set to the third state; and in the non-conductive state, the first gate driving circuit is set to the second state and the second gate driving circuit is set to the fourth state.

In a semiconductor device of the present invention, the first gate driving circuit and the second gate driving circuit are controlled by control signals whose reference potentials are different from each other.

In a semiconductor device of the present invention, the semiconductor element is of a normally-off type; the control section includes: a first power supply for applying a voltage higher than the threshold voltage of the first gate electrode between the first electrode and the first gate electrode; and a second power supply for applying a voltage higher than the threshold voltage of the second gate electrode between the second electrode and the second gate electrode; the first gate driving circuit connects the first power supply between the first electrode and the first gate electrode in the first state, and shorts the first electrode and the first gate electrode with each other in the second state; and the second gate driving circuit connects the second power supply between the second electrode and the second gate electrode in the third state, and shorts the second electrode and the second gate electrode with each other in the fourth state.

In a semiconductor device of the present invention, the semiconductor element is of a normally-on type; the control section includes: a third power supply for applying a voltage less than or equal to the threshold voltage of the first gate electrode between the first electrode and the first gate electrode; and a fourth power supply for applying a voltage less than or equal to the threshold voltage of the second gate electrode between the second electrode and the second gate electrode; the first gate driving circuit shorts the first electrode and the first gate electrode with each other in the first state, and connects the third power supply between the first electrode and the first gate electrode in the second state; and the second gate driving circuit shorts the second electrode and the second gate electrode with each other in the third state, and connects the fourth power supply between the second electrode and the second gate electrode in the fourth state.

In a semiconductor device of the present invention, the control section includes: a first power supply for applying a voltage higher than the threshold voltage of the first gate electrode between the first electrode and the first gate electrode; a second power supply for applying a voltage higher than the threshold voltage of the second gate electrode between the second electrode and the second gate electrode; a third power supply for applying a voltage less than or equal to the threshold voltage of the first gate electrode between the first electrode and the first gate electrode; and a fourth power supply for applying a voltage less than or equal to the threshold voltage of the second gate electrode between the second electrode and the second gate electrode; the first gate driving circuit connects the first power supply between the first electrode and the first gate electrode in the first state, and connects the third power supply between the first electrode and the first gate electrode in the second state; and the second gate driving circuit connects the second power supply between the second electrode and the second gate electrode in the third state, and connects the fourth power supply between the second electrode and the second gate electrode in the fourth state.

In a semiconductor device of the present invention, the control section includes: a driver power supply for supplying a power to the first gate driving circuit; a capacitor for supplying a power to the second gate driving circuit; and a charging circuit for charging the capacitor; and the charging circuit includes a charging switch circuit connected between the driver power supply and the capacitor and charging the capacitor by the driver power supply.

In a semiconductor device of the present invention, the charging switch circuit includes a semiconductor switch, and a diode connected in series with the semiconductor switch.

In a semiconductor device of the present invention, the semiconductor switch is a p-channel MOSFET, a p-channel IGBT or a PNP transistor.

In a semiconductor device of the present invention, the charging circuit charges the capacitor when a current flows between the second electrode and the first electrode.

In a semiconductor device of the present invention, the control section includes a first step-down circuit connected between the first gate driving circuit and the first gate electrode; and a second step-down circuit connected between the second gate driving circuit and the second gate electrode.

In a semiconductor device of the present invention, the first step-down circuit and the second step-down circuit each include a resistor element and a Zener diode.

In a semiconductor device of the present invention, the second gate driving circuit includes a photocoupler for electrically insulating the second control signal from the potential of the second electrode.

In a semiconductor device of the present invention, the second gate driving circuit includes a level shift circuit for converting a signal level of the second control signal.

In a semiconductor device of the present invention, the control section includes a delay circuit for delaying the first control signal and inputting the delayed signal to the first control terminal; and a delay time of the delay circuit is equal to that of the level shift circuit.

In a semiconductor device of the present invention, the second gate driving circuit includes a transformer whose primary side is connected between the first electrode and the second electrode, whose secondary side is connected between the second gate electrode and the second control terminal, and wherein a voltage and a phase of an output from the secondary side are equal to those of an input to the primary side.

In a semiconductor device of the present invention, the second gate driving circuit includes: a transformer whose primary side is connected between the first electrode and the second electrode, whose secondary side is connected between the second gate electrode and the second control terminal, and wherein a voltage of an output from the secondary side is equal to that of an input to the primary side, and a phase of the output from the secondary side is shifted from that of the input to the primary side; and a phase compensation circuit for compensating for a phase shift between the primary side and the secondary side.

In a semiconductor device of the present invention, the phase compensation circuit includes a capacitor.

In a semiconductor device of the present invention, the second gate driving circuit includes a transformer whose primary side receives the second control signal, and whose secondary side is connected to the second electrode and the second gate electrode.

In a semiconductor device of the present invention, the second gate driving circuit includes a pulsed current generating section connected to the primary side of the transformer for generating a pulsed current; and the second control signal is input to the transformer via the pulsed current generating section.

In a semiconductor device of the present invention, the first gate driving circuit directly applies the first control signal between the first electrode and the first gate electrode.

In a semiconductor device of the present invention, the first control signal and the second control signal are a same signal.

A method for driving a semiconductor device of the present invention is a method for driving a semiconductor device including a semiconductor element, the semiconductor element including a first electrode, a first gate electrode, a second gate electrode and a second electrode formed in this order while being spaced apart from one another on a semiconductor layer stack, which is formed on a substrate, the method including the steps of: applying a voltage higher than a threshold voltage of the first gate electrode between the first electrode and the first gate electrode and applying a voltage higher than a threshold voltage of the second gate electrode between the second electrode and the second gate electrode, whereby the semiconductor device is brought to a conductive state in which a current flows in both directions between the first electrode and the second electrode; and applying a voltage less than or equal to the threshold voltage of the first gate electrode between the first electrode and the first gate electrode and applying a voltage less than or equal to the threshold voltage of the second gate electrode between the second electrode and the second gate electrode, whereby the semiconductor device is brought to a non-conductive state in which a path between the first electrode and the second electrode is blocked.

The method for driving a semiconductor device of the present invention includes the step of applying a voltage less than or equal to the threshold voltage of the first gate electrode between the first electrode and the first gate electrode and applying a voltage less than or equal to the threshold voltage of the second gate electrode between the second ohmic electrode and the second gate electrode, whereby the semiconductor device is brought to a non-conductive state in which a path between the first ohmic electrode and the second ohmic electrode is blocked. Therefore, even if the potential of the second ohmic electrode is lower than that of the first ohmic electrode, the channel region is pinched off under the second gate electrode. Thus, it is possible to block the current flow in either direction between the first ohmic electrode and the second ohmic electrode, thus realizing a bidirectional switch.

Effects of the Invention

With the semiconductor device of the present invention and the method for driving the same, it is possible to realize a semiconductor device which has excellent reverse voltage characteristics, which as a single element constitutes a bidirectional switch product, and which allows for the application of a high gate voltage, and a method for driving the same.

Figure 1:
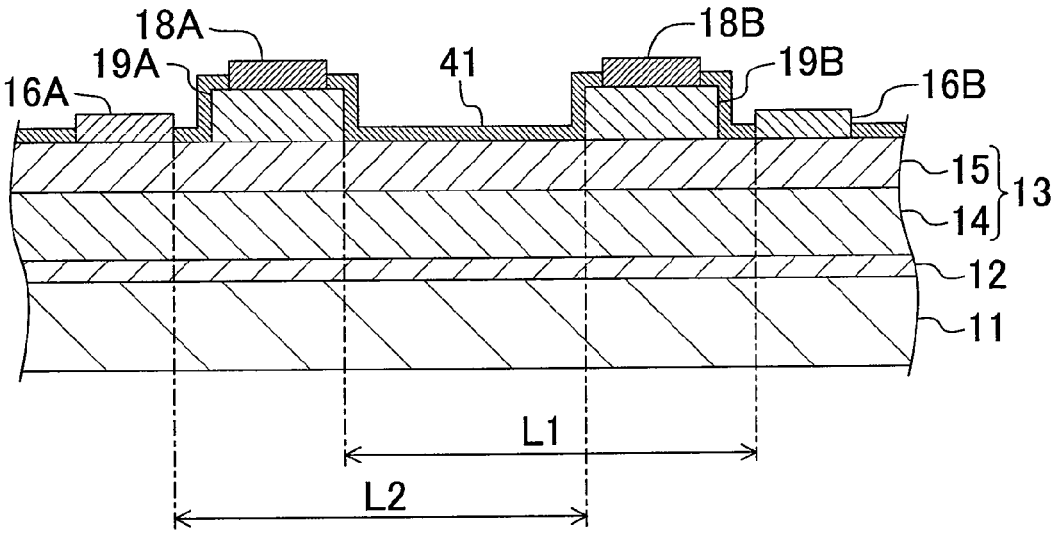
FIG. 1 A cross-sectional view showing a semiconductor device according to a first embodiment of the present invention.

| DESCRIPTION OF REFERENCE NUMERALS | |
|---|---|
| 10 | Semiconductor element |
| 11 | Substrate |
| 12 | Buffer layer |
| 13 | Semiconductor layer stack |
| 14 | First semiconductor layer |
| 15 | Second semiconductor layer |
| 16A | First electrode |
| 16B | Second electrode |
| 16C | Integral electrode |
| 17 | Third semiconductor layer |
| 18A | First gate electrode |
| 18B | Second gate electrode |
| 19 | P-type GaN layer |

-continued

| DESCRIPTION OF REFERENCE NUMERALS | |
|---|---|
| 19A | First control layer |
| 19B | Second control layer |
| 20 | Control section |
| 21 | First power supply |
| 22 | Second power supply |
| 23A | First switch circuit |
| 23B | Second switch circuit |
| 25 | Third power supply |
| 26 | Fourth power supply |
| 30 | Load circuit |
| 31 | Load power supply |
| 35 | Variable power supply |
| 36 | First transistor |
| 37 | Second transistor |
| 41 | Passivation film |
| 42 | Etching absorbing layer |
| 43 | High resistance layer |
| 44 | Fourth semiconductor layer |
| 45 | Impurity layer |
| 46 | Oxide film layer |
| 51 | First power supply |
| 52 | Second power supply |
| 53 | Driver element |
| 53A | Low-side gate driving circuit |
| 53B | High-side gate driving circuit |
| 53C | Level shift circuit |
| 54 | First signal source |
| 55 | Second signal source |
| 61 | Capacitor |
| 63 | Charging circuit |
| 64 | First step-down circuit |
| 64A | Resistor |
| 64B | Zener diode |
| 65 | Second step-down circuit |
| 65A | Resistor |
| 65B | Zener diode |
| 66 | Driver power supply |
| 67 | Logic circuit |
| 67A | NAND circuit |
| 67B | Delay circuit |
| 68 | Semiconductor switch |
| 69 | Diode |
| 70 | Transformer |
| 71 | N-channel MOSFET |
| 72 | Diode |
| 73 | Zener diode |
| 74 | First power supply |
| 75 | Resistor element |
| 83 | Gate driving circuit |
| 84 | First switching element |
| 85 | Second switching element |
| 86 | Third switching element |
| 87 | Fourth switching element |
| 88 | Inductor |
| 89 | Capacitor |
| 90 | Bidirectional switching circuit |

BEST MODE FOR CARRYING OUT THE INVENTION

First Embodiment

A first embodiment of the present invention will be described with reference to the drawings. FIG. 1 shows a cross section of a nitride semiconductor device according to the first embodiment of the present invention. As shown in FIG. 1, the semiconductor device of the present embodiment is a dual-gate semiconductor element. Specifically, a buffer layer 12 of AlN having a thickness of 100 nm is formed on a substrate 11 of sapphire in which the orientation of the principal plane is (0001), and a semiconductor layer stack 13 is formed thereon. The semiconductor layer stack 13 includes a first semiconductor layer 14 of undoped GaN having a thickness of 1 μm and a second semiconductor layer 15 of undoped $Al_{0.15}Ga_{0.85}N$ having a thickness of 25 nm, which are formed in this order from the bottom.

A first electrode 16A and a second electrode 16B are formed from a stack of titanium (Ti) and aluminum (Al) so as to be spaced apart from each other on the second semiconductor layer 15, wherein one of the first electrode 16A and the second electrode 16B is to be the source electrode and the other the drain electrode. A first control layer 19A and a second control layer 19B each of p-type doped GaN having a thickness of 200 nm are formed spaced apart from each other on a region of the second semiconductor layer 15 between the first electrode 16A and the second electrode 16B. A first gate electrode 18A of nickel (Ni) is formed on the first control layer 19A. A second gate electrode 18B of Ni is formed on the second control layer 19B. A passivation film 41 of silicon nitride is formed on the second semiconductor layer 15, the first control layer 19A and the second control layer 19B.

The first control layer 19A and the second control layer 19B are formed in a stripe pattern having a width of 1.5 μm, for example, on the second semiconductor layer 15, and the first gate electrode 18A and the second gate electrode 18B are formed in a stripe pattern having a width of 1 μm. In order to realize a sufficiently large drain breakdown voltage, the distance L1 from a side end of the first control layer 19A to a side end of the second electrode 16B is preferably 5 μm or more. The distance L2 from a side end of the second control layer 19B to a side end of the first electrode 16A is preferably 5 μm or more.

Operation principles of the semiconductor device of the first embodiment will now be described. The transistor of the first embodiment includes the first gate electrode 18A formed on the first control layer 19A having the p-type conductivity. Therefore, by applying a forward bias from the first gate electrode 18A to a channel region that is produced in an interface region between the first semiconductor layer 14 and the second semiconductor layer 15, holes can be injected into the channel region. Since hole mobility is much lower than electron mobility in a nitride semiconductor, holes injected into the channel region hardly contribute as a current carrier. The holes injected from the first gate electrode 18A generate the same amount of electrons in the channel region. Accordingly, the holes have an increased effect of generating electrons in the channel region, and thus act like donor ions. In other words, since a carrier concentration can be modulated in the channel region, a normally-off type nitride semiconductor transistor having a large operating current can be realized.

The present invention is similar in structure to a JFET, but the carrier injection is done intentionally and the present invention is therefore totally different in operation principles from a JFET, which realizes carrier modulation in the channel region by means of the gate electric field. Specifically, it operates as a JFET up to a gate voltage of 3 V, but where there is applied a gate voltage of 3 V or more, exceeding the built-in potential of the pn junction, holes are injected into the gate, thus increasing the current by the above-described mechanism, thereby realizing an operation with a large current and a low ON-resistance.

When a voltage exceeding the forward turn-ON voltage, e.g., a voltage exceeding about 1 V, is applied to a conventional FET using a nitride, a large gate current flows in, and it is no longer possible to realize a normal switching operation. Therefore, a gate voltage of only about 0.8 V can be applied, and an erroneous operation may therefore occur due to noise. With the semiconductor device of the present embodiment, however, it is possible to apply a high gate voltage, making it unlikely that an erroneous operation occurs due to noise.

In the semiconductor device of the present embodiment, the second control layer 19B is formed near the second electrode 16B, and the second gate electrode 18B is formed on the second control layer 19B. The second gate electrode 18B can also control the channel region, as can the first gate electrode 18A. Therefore, the electrical conductivity between the first electrode 16A and the second electrode 16B is controlled by the second gate electrode 18B, and by applying a potential less than or equal to that of the second electrode 16B to the second gate electrode 18B at least when the potential of the second electrode 16B is lower than that of the first electrode 16A, it is possible to pinch off the channel region under the second control layer 19B. As a result, unlike with the conventional FET, no current flows between the first electrode 16A and the second electrode 16B, thus exhibiting excellent reverse voltage characteristics.

When the second gate electrode 18B and the second electrode 16B are electrically connected with each other, the second gate electrode 18B has the same potential as that of the second electrode 16B. Therefore, when a positive bias is applied to the second electrode 16B, a positive bias is applied also to the second gate electrode 18B, and the electrical conductivity between the first electrode 16A and the second electrode 16B is controlled by the first gate electrode 18A. On the other hand, when a negative bias is applied to the second electrode 16B, a negative bias is applied also to the second gate electrode 18B. Therefore, a depletion layer expands in a region of the first semiconductor layer 14 and the second semiconductor layer 15 under the second control layer 19B, thereby pinching off the channel region. As a result, unlike the conventional FET, no current flows between the first electrode 16A and the second electrode 16B when a negative bias is applied to the second electrode 16B, thus exhibiting excellent reverse voltage characteristics.

Figure 2:
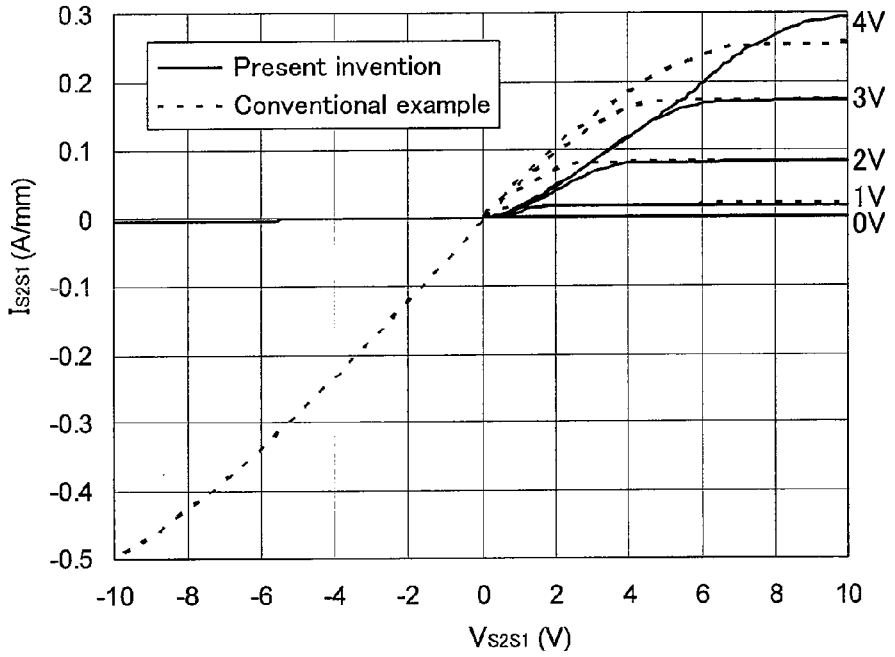
FIG. 2 A graph showing current-voltage characteristics of the semiconductor device according to the first embodiment of the present invention.

FIG. 2 shows the $V_{S2S1}$-$I_{S2S1}$ characteristics where the second gate electrode 18B and the second electrode 16B are electrically connected (shorted) with each other, with the first electrode 16A being the source electrode and the second electrode 16B being the drain electrode. $V_{S2S1}$ is the voltage between the second electrode 16B and the first electrode 16A, and corresponds to the drain voltage Vds of an ordinary FET. $I_{S2S1}$ is the current between the second electrode 16B and the first electrode 16A, and corresponds to the drain current Ids of an ordinary FET. $V_{S2S1}$ along the horizontal axis in FIG. 2 is a voltage with respect to the first electrode 16A, and $I_{S2S1}$ along the vertical axis is plotted assuming that the positive direction is the direction of a current flow from the second electrode 16B toward the first electrode 16A. The figure shows cases where voltages of 0 V, 1 V, 2 V, 3 V and 4 V are applied to the first gate electrode 18A.

The conventional semiconductor device with no second gate electrode 18B, denoted by a broken line in FIG. 2, has a negative $I_{S2S1}$ (drain current) flowing therethrough when $V_{S2S1}$ (drain voltage) is negative, regardless of the gate voltage, clearly indicating that the conventional semiconductor device does not have reverse voltage characteristics.

On the other hand, the semiconductor device of the present embodiment does not have $I_{S2S1}$ flowing therethrough even if $V_{S2S1}$ is negative, regardless of the voltage applied to the first gate electrode 18A, clearly indicating that the semiconductor device has excellent reverse voltage characteristics.

With such excellent reverse voltage characteristics, it is possible to realize a control in four quadrants, which cannot be realized with the conventional semiconductor device.

In the semiconductor device of the present embodiment, the first control layer 19A and the second control layer 19B may be doped with about $1\times10^{19}$ $cm^{-3}$ of magnesium (Mg), in which case the carrier concentration is about $1\times10^{18}$ $cm^{-3}$. Portions of the second semiconductor layer 15 under the first control layer 19A and the second control layer 19B may contain impurities thermally diffused from the first control layer 19A and the second control layer 19B. While GaN is used herein for the first control layer 19A and the second control layer 19B, AlGaN may be used.

While the material of the first gate electrode 18A and the second gate electrode 18B is herein Ni, it may be any material as long as it exhibits desirable ohmic characteristics with the first control layer 19A and the second control layer 19B, and may be palladium (Pd), or the like.

While the first electrode 16A and the second electrode 16B are herein formed on the second semiconductor layer 15, any structure may be used as long as they can be electrically connected through a tunneling current to the two-dimensional electron gas that is produced at the heterojunction interface between the first semiconductor layer 14 and the second semiconductor layer 15 to form an ohmic junction. For example, impurities such as silicon (Si) may be selectively diffused into regions of the second semiconductor layer 15 under the first electrode 16A and the second electrode 16B.

While a sapphire substrate is used herein, a substrate of SiC, GaN, Si, or the like, may be used, and the orientation of the principal plane is not limited to (0001) as long as a desirable crystal can be grown.

While the description of the present embodiment is directed to a single semiconductor device, there may be a plurality of semiconductor devices formed with the provision of device isolation regions. The device isolation regions may be formed by, for example, selectively increasing the resistance of a first device isolation region and that of a second device isolation region by implanting boron (B) ions into these regions.

Figure 3:
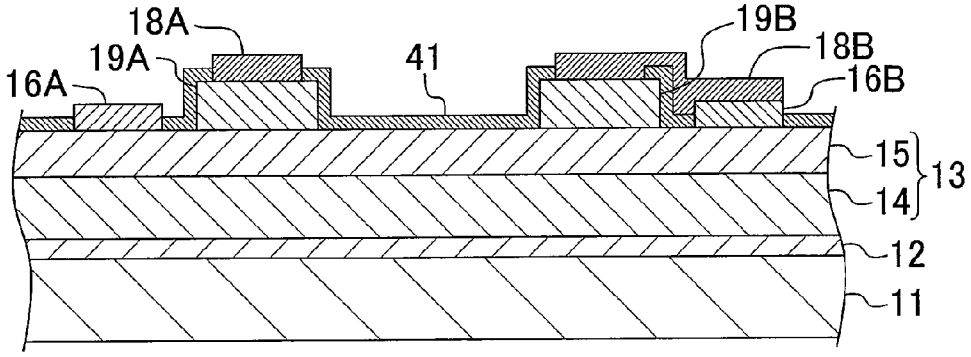
FIG. 3 A cross-sectional view showing a variation of the semiconductor device according to the first embodiment of the present invention.

As shown in FIG. 3, the second gate electrode 18B may be formed so as to cover the top of the second electrode 16B, thereby shorting the second electrode 16B and the second gate electrode 18B with each other. This simplifies the wiring process. Conversely, the second electrode 16B may be formed so as to cover the second gate electrode 18B.

Second Embodiment

Figure 4:
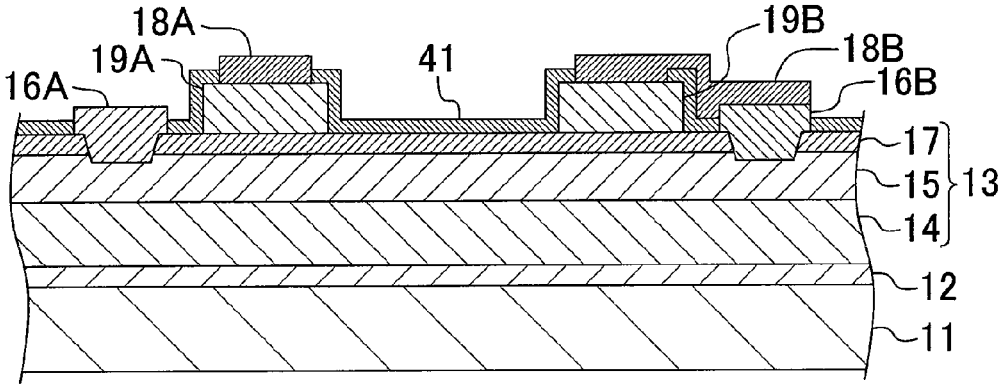
FIG. 4 A cross-sectional view showing a semiconductor device according to a second embodiment of the present invention.

A second embodiment of the present invention will now be described with reference to the drawings. FIG. 4 shows a cross section of a semiconductor device of the second embodiment. In FIG. 4, like elements to those of FIG. 3 are denoted by like reference numerals and will not be further described below.

As shown in FIG. 4, the semiconductor device of the present embodiment includes a third semiconductor layer 17 of p-type doped $Al_{0.2}Ga_{0.8}N$ having a thickness of 15 nm between the second semiconductor layer 15 and the first control layer 19A and the second control layer 19B.

The first control layer 19A and the second control layer 19R are typically formed by forming a nitride semiconductor layer of p-type GaN on the second semiconductor layer 15 and then selectively etching the p-type nitride semiconductor layer by dry etching using a chlorine gas, for example. However, it is very difficult to completely remove by etching only the p-type nitride semiconductor layer to be the first control layer and the second control layer without etching the second nitride semiconductor layer. As a result, the structure may be overetched wherein the second semiconductor layer 15 is etched, or underetched wherein the p-type nitride semiconductor layer partly remains on the second semiconductor layer 15. With overetching, the thickness of the second semiconductor layer 15 is reduced, and the concentration of the two-dimensional electron gas (2DEG) generated by polarization is reduced, thereby lowering the maximum current (Imax). With underetching, the first electrode 16A and the second electrode 16B, being n-type ohmic electrodes, are formed on the portion of the p-type nitride semiconductor layer remaining through the etching process, thereby increasing the contact resistance of the first electrode 16A and the second electrode 16B. However, the semiconductor device of the present embodiment includes the third semiconductor layer 17 of the p-type conductivity having a lower etching rate than that of the first control layer 19A and the second control layer 19B, whereby the p-type nitride semiconductor layer can be completely etched away except for portions thereof to be the first control layer 19A and the second control layer 19B. As a result, it is possible to obtain, with desirable reproducibility, a semiconductor device having excellent device characteristics.

In the present embodiment, the first electrode 16A and the second electrode 16B are formed in the opening formed in the third semiconductor layer 17 and are in contact with the second semiconductor layer 15. However, the first electrode 16A and the second electrode 16B may have any other structure as long as they can form an ohmic contact with the channel region, and an even more desirable ohmic contact may be realized by forming these electrodes so as to run through the second semiconductor layer 15 to be in contact with the first semiconductor layer 14.

While the second gate electrode 18B is formed so as to cover the top of the second electrode 16B in the illustrated example, the second gate electrode 18B and the second electrode 16B may be shorted with each other by a wire.

Third Embodiment

Figure 5:
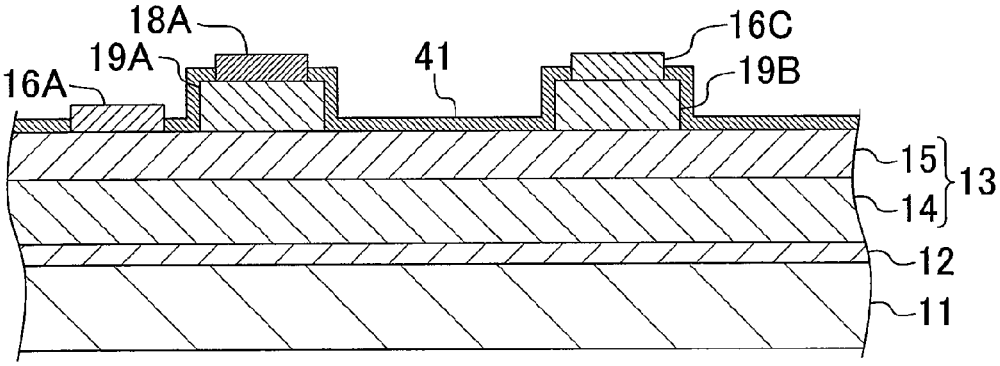
FIG. 5 A cross-sectional view showing a semiconductor device according to a third embodiment of the present invention.

A third embodiment of the present invention will now be described with reference to the drawings. FIG. 5 shows a cross section of a semiconductor device of the third embodiment. In FIG. 5, like elements to those of FIG. 1 are denoted by like reference numerals and will not be further described below. As shown in FIG. 5, the semiconductor device of the present embodiment includes an integral electrode 16C of Ni on the second control layer 19B, wherein the integral electrode 16C is an integration of the second gate electrode and the second electrode.

Figure 6:
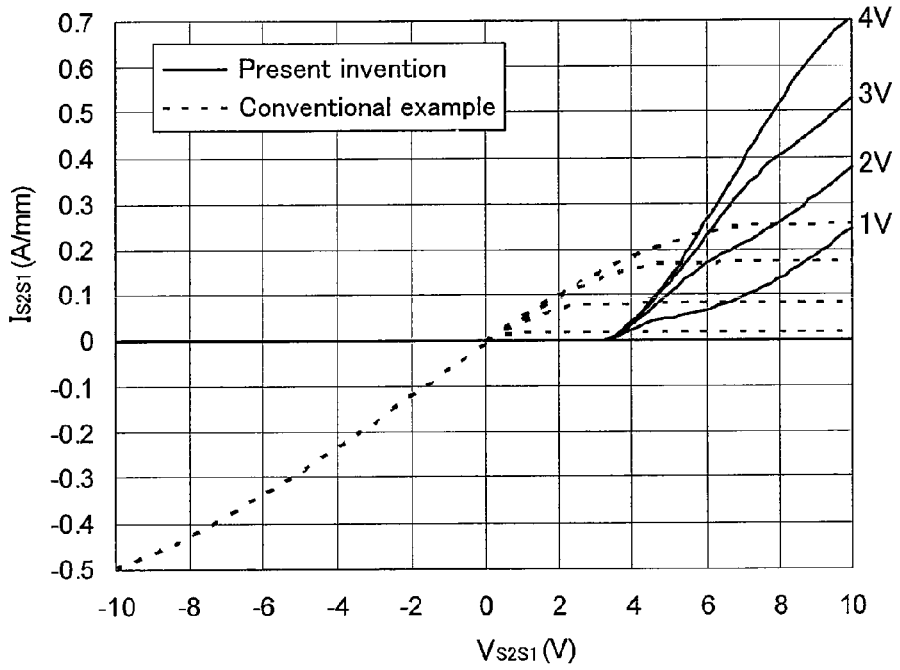
FIG. 6 A graph showing current-voltage characteristics of the semiconductor device according to the third embodiment of the present invention.

FIG. 6 shows the $V_{S2S1}$-$I_{S2S1}$ characteristics of the semiconductor device of the present embodiment, in comparison with those of the conventional semiconductor device with no second control layer. In FIG. 6, $V_{S2S1}$ is a voltage with respect to the first electrode 16A, and $I_{S2S1}$ along the vertical axis is plotted assuming the positive direction is the direction of a current flow from the second electrode 16B toward the first electrode 16A. For the conventional semiconductor device, $V_{S2S1}$ denotes the drain voltage Vds and $I_{S2S1}$ the drain current Ids. FIG. 6 shows cases where the gate voltage is 0 V, 1 V, 2 V, 3 V and 4 V.

The conventional semiconductor device, denoted by a broken line in FIG. 6, has a negative $I_{S2S1}$ (drain current) flowing therethrough when $V_{S2S1}$ (drain voltage) is negative even if the gate voltage is 0 V, clearly indicating that the conventional semiconductor device does not have reverse voltage characteristics. With the semiconductor device of the present embodiment, on the other hand, $I_{S2S1}$ does not flow regardless of the gate voltage when $V_{S2S1}$ is negative, clearly indicating that the semiconductor device has excellent reverse voltage characteristics. A pn junction is formed by the second control layer 19B and the channel region. Therefore, in an operation region where a positive bias is applied to the integral electrode 16C, a current suddenly starts flowing when the drain voltage becomes 3V or higher which is the forward ON voltage of a GaN-based pn junction, thus showing an operation as if it were an IGBT. As a result, the degree of conductivity is modulated, and a large drain current can be obtained.

While the material of the integral electrode 16C is Ni in the present embodiment, any material may be used as long as it exhibits desirable ohmic characteristics with the second control layer 19B, and may be Pd, or the like, for example.

Figure 7:
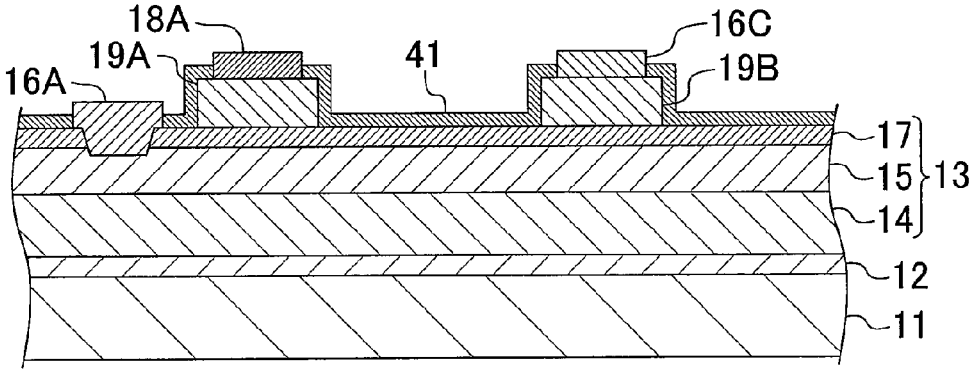
FIG. 7 A cross-sectional view showing a variation of the semiconductor device according to the third embodiment of the present invention.

As shown in FIG. 7, the third semiconductor layer 17 may be formed between the second semiconductor layer 15 and the first control layer 19A and the second control layer 19B, as in the second embodiment. However, the first electrode 16A may have any other structure as long as it can form an ohmic contact with the channel region, and an even more desirable ohmic contact may be realized by forming the electrode so as to run through the second semiconductor layer 15 to be in contact with the first semiconductor layer 14.

Fourth Embodiment

Figure 8:
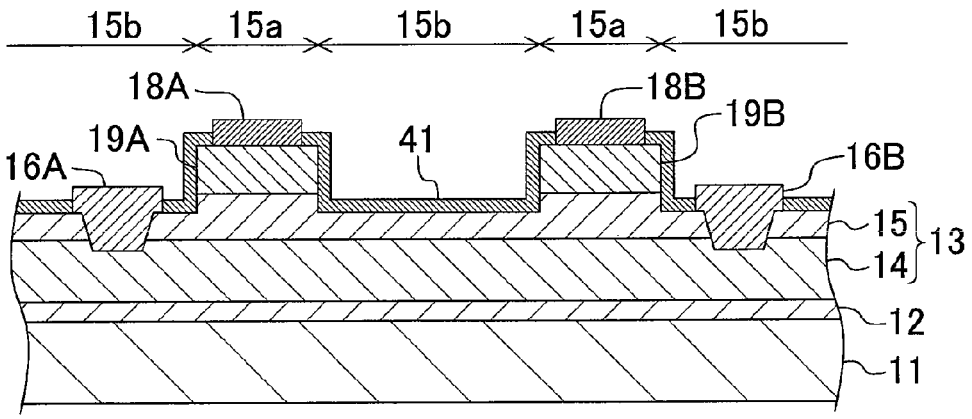
FIG. 8 A cross-sectional view showing a semiconductor device according to a fourth embodiment of the present invention.

A fourth embodiment of the present invention will be described with reference to the drawings. FIG. 8 shows a cross section of a semiconductor device of the fourth embodiment. In FIG. 8, like elements to those of FIG. 1 are denoted by like reference numerals and will not be further described below. As shown in FIG. 8, in the semiconductor device of the present embodiment, the second semiconductor layer 15 includes first portions 15a having a larger thickness, and second portions 15b having a smaller thickness than the first portions 15a. The first control layer 19A and the second control layer 19B are formed on the first portions 15a. In other words, the first control layer 19A and the second control layer 19B are formed on protruding portions of the second semiconductor layer 15.

Figure 9:
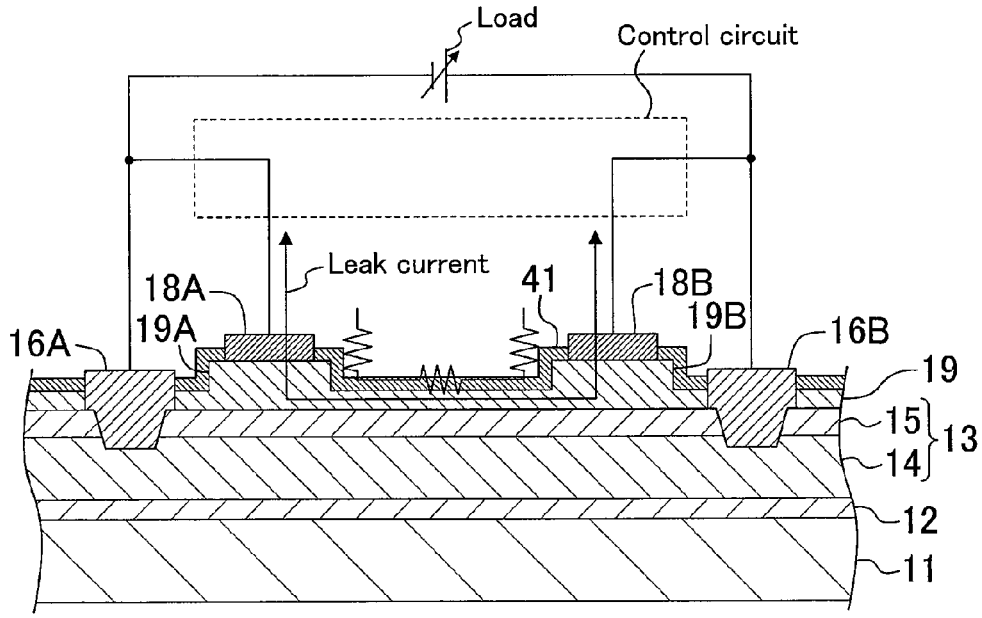
FIG. 9 A cross-sectional view illustrating problems with a dual-gate semiconductor device.

The first control layer 19A and the second control layer 19B are formed by forming a p-type GaN layer on the second semiconductor layer 15 and then selectively removing the p-type GaN layer. In such a case, if the p-type GaN layer is underetched as shown in FIG. 9, the p-type GaN layer partly remains between the first control layer 19A and the second control layer 19B, resulting in a state where the first control layer 19A and the second control layer 19B are electrically connected with each other with a resistor therebetween. In a normally-off type dual-gate semiconductor element, the first gate electrode 18A and the second gate electrode 18B are in an ohmic contact with the first control layer 19A and the second control layer 19B, respectively. Thus, there is a non-negligible current flowing between the first gate electrode 18A and the second gate electrode 18B via the remaining portion of the p-type GaN layer. Especially, when there is formed a bidirectional switch device as shown in FIG. 9, a leak path may be formed between the first electrode 16A and the second electrode 16B, whereby a non-conductive state cannot be sustained.

In the semiconductor device of the present embodiment, in the formation of the first control layer 19A and the second control layer 19B, the p-type GaN layer is overetched so as to remove even a portion of the second semiconductor layer 15. Therefore, it is possible to reliably remove the p-type GaN layer except for the first control layer 19A and the second control layer 19B. Then, the second semiconductor layer 15 has a larger thickness in areas where the first control layer 19A and the second control layer 19B are formed.

The amount by which the second semiconductor layer 15 is overetched may be determined in view of the thickness of the second semiconductor layer 15 when grown, the threshold voltage, variations in the amount of etching, etc. For example, where the second semiconductor layer 15 is grown to 60 nm and the p-type GaN layer to 300 nm, the amount of overetching may be 40 nm. Then, the thickness of the first portion 15a will be 60 nm and that of the second portion 15b 20 nm. Thus, it is possible to substantially completely remove an unnecessary portion of the p-type GaN layer. The thickness of the second semiconductor layer 15 substantially influences the current characteristics between the first electrode 16A and the second electrode 16B. Therefore, the thickness of the second semiconductor layer 15 cannot be made excessively small. However, with the semiconductor device of the present embodiment, a thickness of 20 nm can be ensured for the second semiconductor layer 15 even in the overetched second portion 15b, thereby suppressing the current characteristics deterioration.

The thickness of the first portion 15a may be even larger, e.g., about 100 nm, as long as it allows for epitaxy on the first semiconductor layer 14 of undoped GaN and it allows for a normally-off operation. As for the lower limit, the thickness can be reduced as long as it is possible to completely remove the residue of the p-type GaN layer remaining between the first control layer 19A and the second control layer 19B. For example, where the amount of overetching is 5 nm, the thickness may be about 25 nm. The thickness of the second portion 15b may be even larger, e.g., about 95 nm, as long as it is possible to completely remove the residue of the p-type GaN layer remaining between the first control layer 19A and the second control layer 19B. As for the lower limit, the thickness can be reduced, e.g., to about 5 nm, as long as the element is operative.

FIG. 8 shows an example where portions of the second semiconductor layer 15 are removed and the first semiconductor layer 14 is dug down by about 40 nm so that the first electrode 16A and the second electrode 16B are in contact with the interface between the second semiconductor layer 15 and the first semiconductor layer 14, in order to reduce the contact resistance Alternatively first electrode 16A and the second electrode 16R may be formed on the second semiconductor layer 15.

First Variation of Fourth Embodiment

Figure 10:
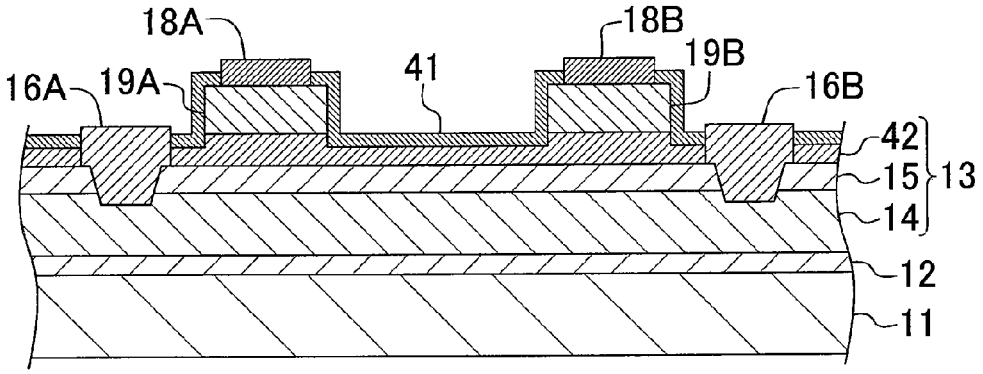
FIG. 10 A cross-sectional view showing a semiconductor device according to a first variation of the fourth embodiment of the present invention.

A first variation of the fourth embodiment of the present invention will now be described with reference to the drawings. FIG. 10 shows a cross section of a semiconductor device according to the first variation of the fourth embodiment. In FIG. 10, like elements to those of FIG. 8 are denoted by like reference numerals and will not be further described below.

As shown in FIG. 10, the semiconductor device of this variation includes an etching absorbing layer 42 between the second semiconductor layer 15 and the first control layer 19A and the second control layer 19B. The etching absorbing layer 42 is of n-type GaN having a thickness of about 50 nm, and portions thereof under the first control layer 19A and the second control layer 19B are thicker than other portions. With such a configuration, the second semiconductor layer 15 is prevented from being etched even if the p-type GaN layer is overetched by about 30 nm in the formation of the first control layer 19A and the second control layer 19B.

If the second semiconductor layer 15 is partially etched by dry etching, the surface of the second semiconductor layer 15 is damaged, thus forming a defect level. Once a defect level is formed, electrons are trapped in the non-conductive state, thereby causing a current collapse phenomenon. By providing the etching absorbing layer 42 as shown in this variation, it is possible to reliably remove an unnecessary portion of the p-type GaN layer without damaging the second semiconductor layer 15. Moreover, the thickness of the second semiconductor layer 15 substantially influences the current characteristics between the first electrode 16A and the second electrode 16B. With the semiconductor device of the present embodiment, the second semiconductor layer 15 is prevented from being overetched, whereby the thickness of the second semiconductor layer 15 will not be varied by overetching. Therefore, it is possible to suppress variations in the current characteristics between semiconductor devices, and to produce semiconductor devices with desirable reproducibility.

The etching absorbing layer 42 may be undoped GaN. The second semiconductor layer 15 may be n-type AlGaN, instead of undoped AlGaN.

Second Variation of Fourth Embodiment

Figure 11:
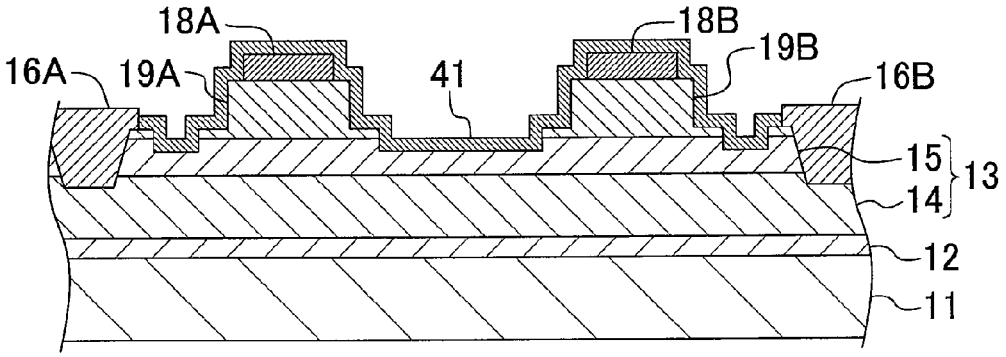
FIG. 11 A cross-sectional view showing a semiconductor device according to a second variation of the fourth embodiment of the present invention.

A second variation of the fourth embodiment of the present invention will now be described with reference to the drawings. FIG. 11 shows a cross section of a semiconductor device according to the second variation of the fourth embodiment. In FIG. 11, like elements to those of FIG. 8 are denoted by like reference numerals and will not be further described below. As shown in FIG. 11, with the semiconductor device of this variation, the first control layer 19A and the second control layer 19B include protruding portions.

In order to reduce the leak current, it is preferred to completely remove an unnecessary portion of the p-type GaN layer. On the other hand, the amount of overetching is preferably minimized, in view of the damage to the second semiconductor layer 15. As will be described below, with the semiconductor device of this variation, it is possible to reliably completely remove an unnecessary portion of the p-type GaN layer while keeping the amount of overetching small.

FIG. 12 shows a sequence of steps for producing the semiconductor device of this variation. First, as shown in FIG. 12(a), the buffer layer 12, the semiconductor layer stack 13 and a p-type GaN layer 19 are formed in this order by an MOCVD method on the substrate 11 of Si. The buffer layer 12 may be formed by alternately layering MN having a thickness of 10 nm and GaN having a thickness of 10 nm to a thickness of 1 μm. The semiconductor layer stack 13 may include the first semiconductor layer 14 of undoped GaN having a thickness of 2 μm, and the second semiconductor layer 15 of n-type or undoped AlGaN having a thickness of 60 nm. The thickness of the p-type GaN layer may be 300 nm.

Figure 12A:
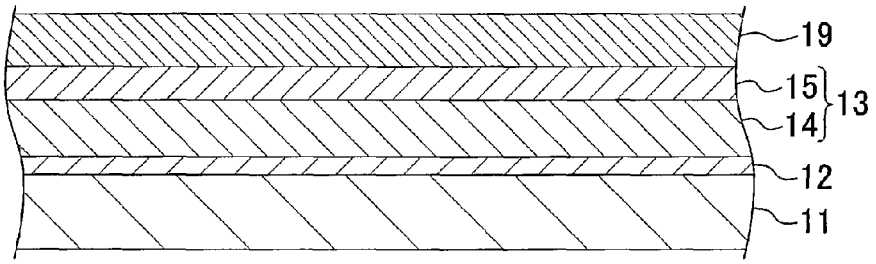
FIG. 12 Cross-sectional views showing a sequence of steps for producing the semiconductor device according to the second variation of the fourth embodiment of the present invention.
Figure 12B:
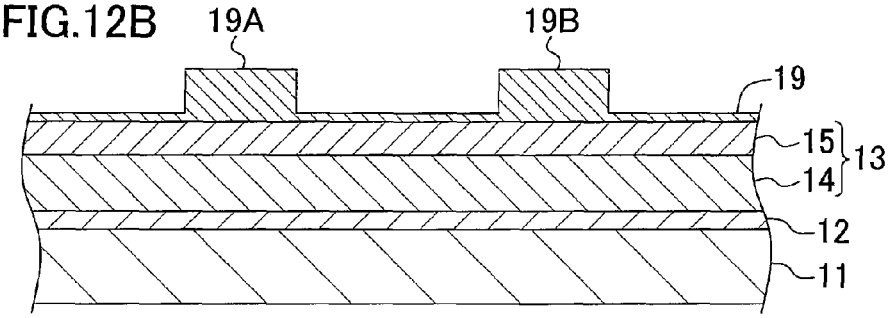

Then, as shown in FIG. 12(b), the p-type GaN layer 19 is selectively removed by ICP (Inductively Coupled Plasma) etching using a $Cl_2$ gas and photolithography, thereby forming the first control layer 19A and the second control layer 19B. At this point, the p-type GaN layer 19 partly remaining between the first control layer 19A and the second control layer 19B is not a problem.

Figure 12C:
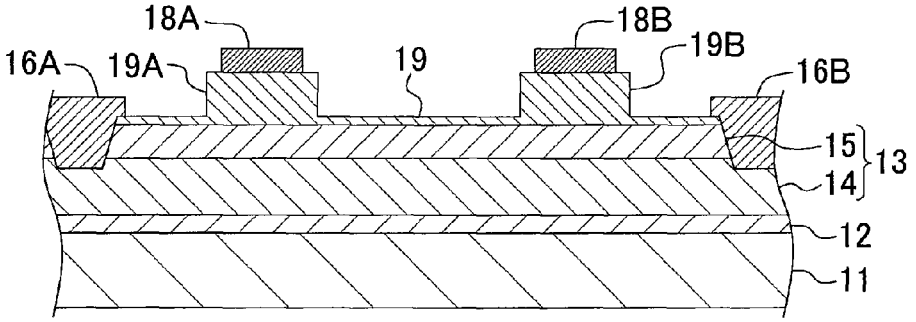

Then, as shown in FIG. 12(c), the first electrode 16A, the second electrode 16B, the first gate electrode 18A and the second gate electrode 18B are formed at their respective predetermined positions, after which the electrical characteristics of the structure are measured. A large leak current measured between the first gate electrode 18A and the second gate electrode 18B indicates that the p-type GaN layer 19 partly remains between the first control layer 19A and the second control layer 19B.

Figure 12D:
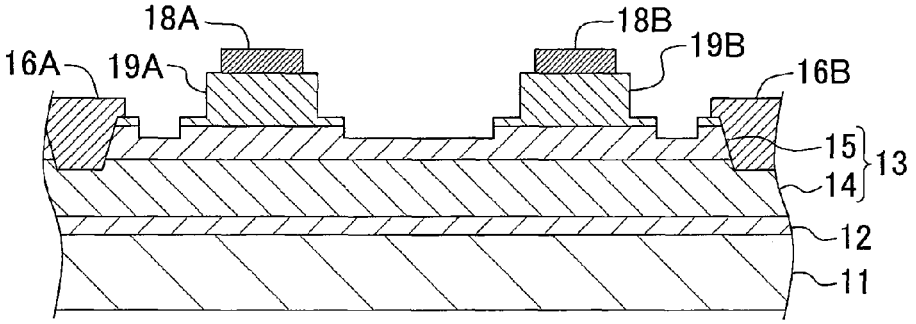

If a remaining portion of the p-type GaN layer 19 is confirmed, the portion of the p-type GaN layer 19 remaining between the first control layer 19A and the second control layer 19B is removed by photolithography and dry etching, as shown in FIG. 12(d).

Since the electrical characteristics can be measured during the course of the process, it is possible to reliably remove an unnecessary portion of the p-type GaN layer 19 even if the amount of overetching is set to a critical level.

Third Variation of Fourth Embodiment

Figure 13:
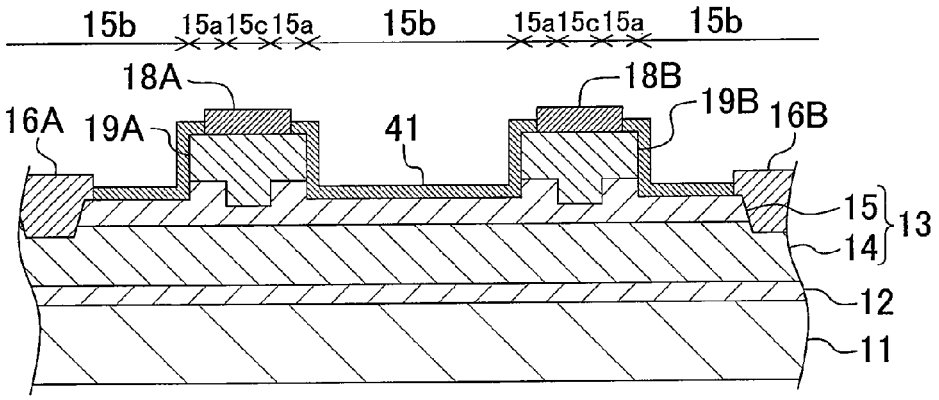
FIG. 13 A cross-sectional view showing a semiconductor device according to a third variation of the fourth embodiment of the present invention.

A third variation of the fourth embodiment of the present invention will now be described with reference to the drawings. FIG. 13 shows a cross section of a semiconductor device according to the third variation of the fourth embodiment. In FIG. 13, like elements to those of FIG. 8 are denoted by like reference numerals and will not be further described below. As shown in FIG. 13, in the semiconductor device of this variation, the second semiconductor layer 15 includes first portions 15a, second portions 15b having a smaller thickness than the first portions 15a, and third portions 15c having a thickness less than or equal to that of the second portions 15b. The first control layer 19A and the second control layer 19B are formed on the first portions 15a and the third portions 15c.

If the p-type GaN layer is overetched in the formation of the first control layer 19A and the second control layer 19B, the thickness of the second semiconductor layer 15 will be small. If the thickness of the second semiconductor layer 15 is small, a defect level may affect the channel region or the two-dimensional electron gas concentration of the channel region may be lowered. In view of this, the thickness of the second semiconductor layer 15 before being overetched is preferably as large as possible. However, if the second semiconductor layer 15 has a large thickness under the first control layer 19A and the second control layer 19B, the threshold voltage decreases, and the normally-off operation may not be realized.

In the semiconductor device of the present embodiment, the second semiconductor layer 15 includes the thick first portions 15a and the thin third portions 15c under the first control layer 19A and the second control layer 19B. Therefore, the threshold voltage is dictated by the thickness of the third portions 15c. Thus, the threshold voltage is not lowered even if the second semiconductor layer 15 has a large thickness before being overetched.

Although the thickness of the first portions 15a is preferably large, the formation of the second semiconductor layer 15 will be difficult if the thickness is excessively large. Therefore, it may be set to about 100 nm, for example. While the thickness of the third portions 15c may be determined according to the threshold voltage needed, it may be set to about 20 nm, for example. The thickness of the second portions 15b may be determined so that it is possible to reliably remove the p-type GaN layer. For example, where the thickness of the first portions 15a is 100 nm, if the thickness of the second portions 15b is set to about 40 nm, it is possible to ensure an amount of overetching of about 60 nm. Thus, it is possible to reliably prevent the p-type GaN layer from remaining unremoved. Since it is possible to ensure a sufficient thickness of the second semiconductor layer 15 after being overetched, it is possible to suppress the influence of a defect level on the channel region and to realize a high two-dimensional electron gas concentration. The second portions 15b and the third portions 15c may have the same thickness.

Fourth Variation of Fourth Embodiment

Figure 14:
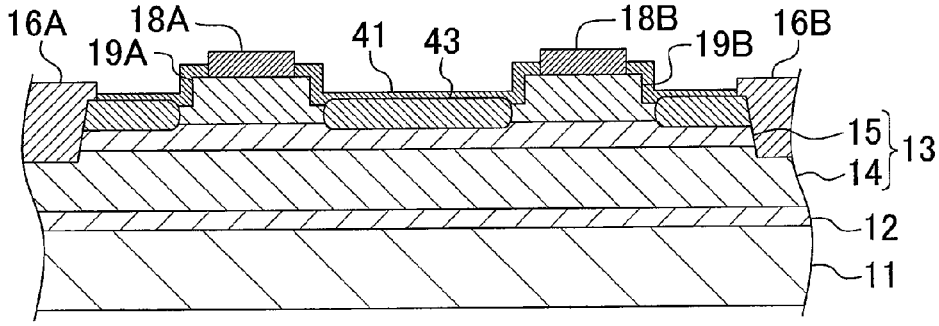
FIG. 14 A cross-sectional view showing a semiconductor device according to a fourth variation of the fourth embodiment of the present invention.

A fourth variation of the fourth embodiment of the present invention will now be described with reference to the drawings. FIG. 14 shows a cross section of a semiconductor device according to the fourth variation of the fourth embodiment. In FIG. 14, like elements to those of FIG. 8 are denoted by like reference numerals and will not be further described below. As shown in FIG. 14, in the semiconductor device of this variation, a high resistance layer 43 of gallium oxide (GaO) is formed on the semiconductor layer stack 13 except for the areas where the first control layer 19A and the second control layer 19B are formed. Thus, it is possible to reliably insulate the first control layer 19A and the second control layer 19B from each other, and to prevent the increase in the leak current. Moreover, the second semiconductor layer 15 will not be damaged, and it is possible to reduce the occurrence of a current collapse due to a defect level.

While the resistance of the high resistance layer 43 is preferably as high as possible, the leak current can be reduced as long as it is higher than the resistance of the first control layer 19A and the second control layer 19B. For example, it can be formed by annealing, in an oxygen atmosphere, the portion of the p-type GaN layer remaining between the first control layer 19A and the second control layer 19B. This facilitates the thickness control, etc. The high resistance layer 43 may be formed by implanting boron ions, or the like of GaO.

Fifth Variation of Fourth Embodiment

Figure 15:
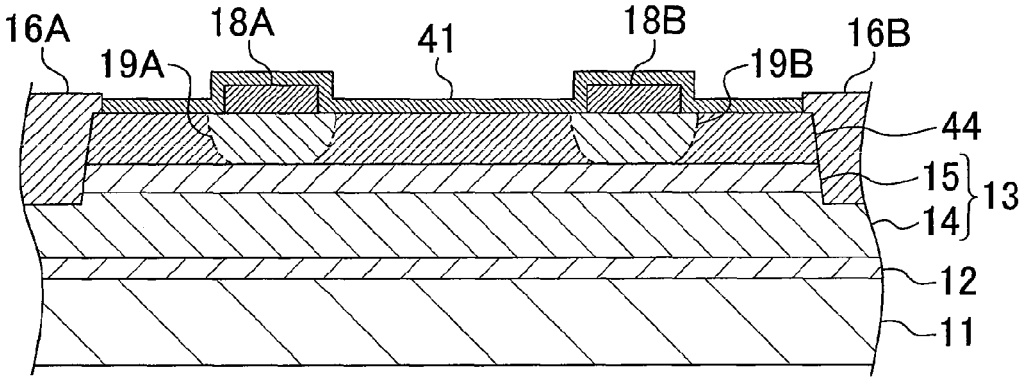
FIG. 15 A cross-sectional view showing a semiconductor device according to a fifth variation of the fourth embodiment of the present invention.

A fifth variation of the fourth embodiment of the present invention will now be described with reference to the drawings. FIG. 15 shows a cross section of a semiconductor device according to the fifth variation of the fourth embodiment. In FIG. 15, like elements to those of FIG. 8 are denoted by like reference numerals and will not be further described below. As shown in FIG. 15, in the semiconductor device of this variation, the first control layer 19A and the second control layer 19B are formed as p-type impurity-diffused regions.

Figure 16A:
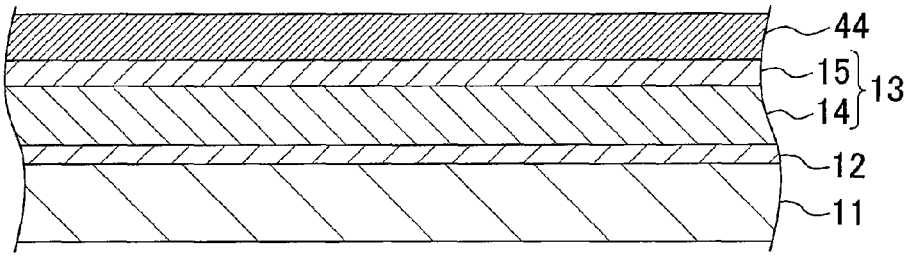
FIG. 16 Cross-sectional views showing a sequence of steps for producing the semiconductor device according to the fifth variation of the fourth embodiment of the present invention.

FIG. 16 shows a sequence of steps for forming the first control layer 19A and the second control layer 19B in the semiconductor device of this variation. First, as shown in FIG. 16(a), the buffer layer 12, the semiconductor layer stack 13 and a fourth semiconductor layer 44 are formed in this order by an MOCVD method on the substrate 11 of Si. The buffer layer 12 may be formed by alternately layering AlN having a thickness of 10 nm and GaN having a thickness of 10 nm to a thickness of 1 μm. The semiconductor layer stack 13 may include the first semiconductor layer 14 of undoped GaN having a thickness of 2 gill, and the second semiconductor layer 15 of n-type or undoped AlGaN having a thickness of 60 nm. The fourth semiconductor layer 44 may be undoped GaN having a thickness of 300 nm.

Figure 16B:
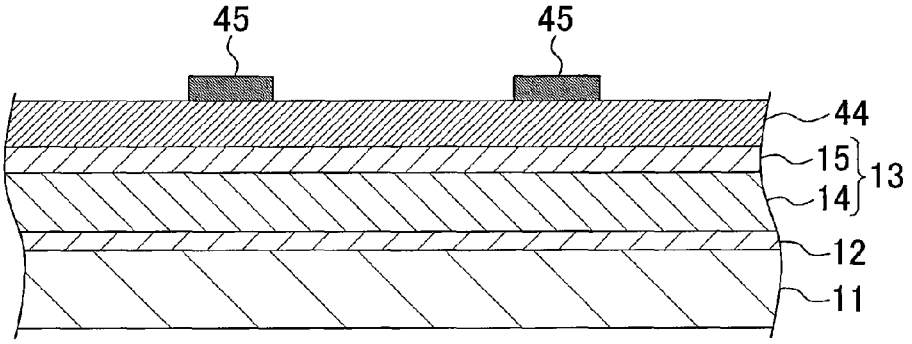

Then, as shown in FIG. 16(b), impurity layers 45 of Mg having a thickness of 100 nm, Ni having a thickness of 10 nm and Pt having a thickness of 10 nm are formed spaced apart from each other on the fourth semiconductor layer 44, by using a lift-off method and a vapor deposition method.

Figure 16C:
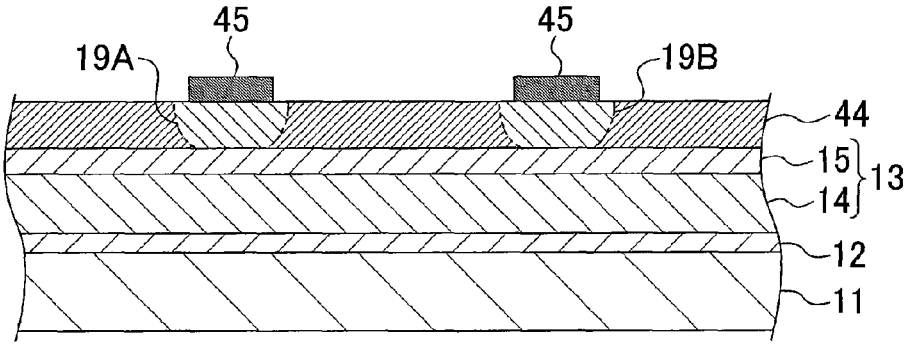

Then, as shown in FIG. 16(c), the structure is annealed at 900° C. in an ammonium ($NH_3$) atmosphere, thereby diffusing Mg into the fourth semiconductor layer 44. Thus, the first control layer 19A and the second control layer 19B of Mg-doped p-type GaN. Then, the impurity layer 45 is removed by using aqua regia, or the like. The electrode formation, etc., can be done by known methods.

Thus, by forming the first control layer 19A and the second control layer 19B by selectively diffusing Mg into the fourth semiconductor layer 44 of undoped GaN, a leak path will not be formed between the first control layer 19A and the second control layer 19B. As no etching is required, the second semiconductor layer 15 will not be damaged. Since the second semiconductor layer 15 is covered by the fourth semiconductor layer 44, the influence of a defect level on the channel region is reduced. The fourth semiconductor layer 44 may be formed by using AlGaN, instead of GaN.

Sixth Variation of Fourth Embodiment

Figure 17:
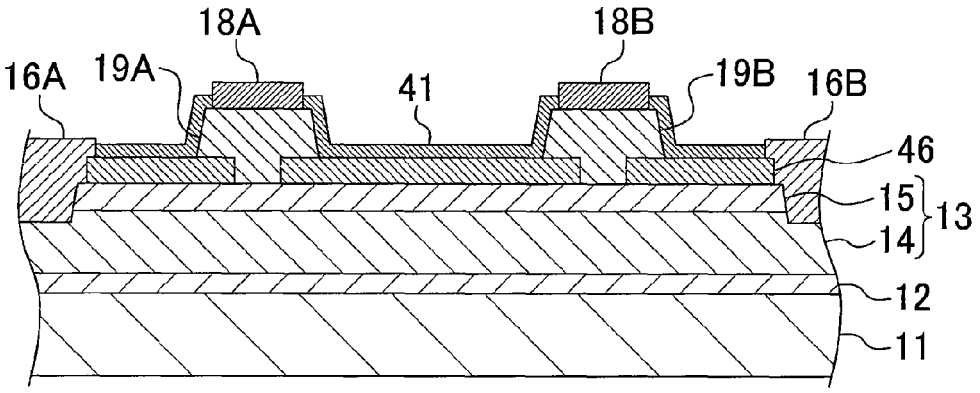
FIG. 17 A cross-sectional view showing a semiconductor device according to a sixth variation of the fourth embodiment of the present invention.

A sixth variation of the fourth embodiment of the present invention will now be described with reference to the drawings. FIG. 17 shows a cross section of a semiconductor device according to the sixth variation of the fourth embodiment. In FIG. 17, like elements to those of FIG. 8 are denoted by like reference numerals and will not be further described below. As shown in FIG. 17, the semiconductor device of this variation includes an oxide film layer 46 of $SiO_2$ covering the second semiconductor layer 15. The oxide film layer 46 includes therein openings spaced apart from each other, and the first control layer 19A and the second control layer 19B are formed in the openings.

Figure 18A:
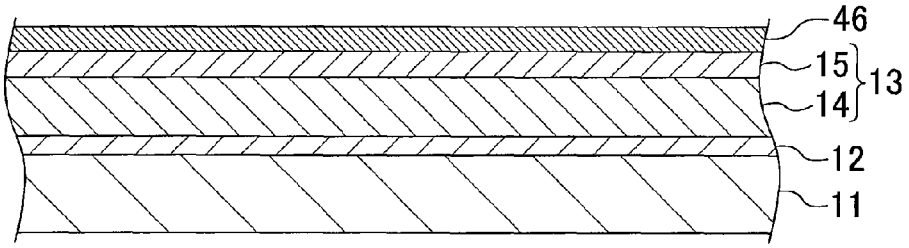
FIG. 18 Cross-sectional views showing a sequence of steps for producing the semiconductor device according to the sixth variation of the fourth embodiment of the present invention.

FIG. 18 shows a sequence of steps for forming the first control layer 19A and the second control layer 19B in the semiconductor device of this variation. First, as shown in FIG. 18(a), the buffer layer 12 and the semiconductor layer stack 13 are formed in this order by an MOCVD method on the substrate 11 of Si. The buffer layer 12 may be formed by alternately layering AlN having a thickness of 10 nm and GaN having a thickness of 10 nm to a thickness of 1 μm. The semiconductor layer stack 13 may include the first semiconductor layer 14 of undoped GaN having a thickness of 2 μm, and the second semiconductor layer 15 of n-type or undoped AlGaN having a thickness of 60 nm.

Figure 18B:
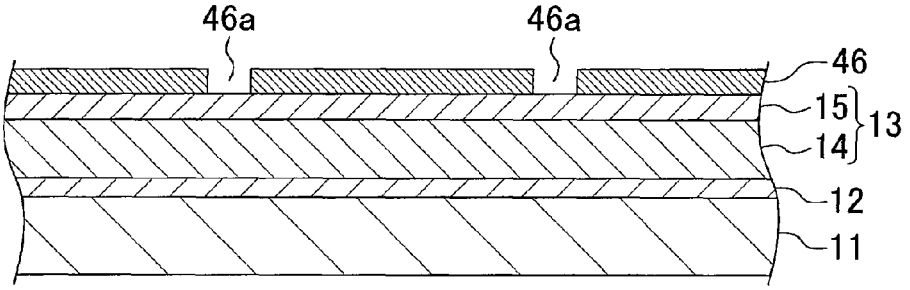

Then, as shown in FIG. 18(b), after the oxide film layer 46 of $SiO_2$ is formed on the second semiconductor layer 15, it is selectively removed to form openings 46a.

Figure 18C:
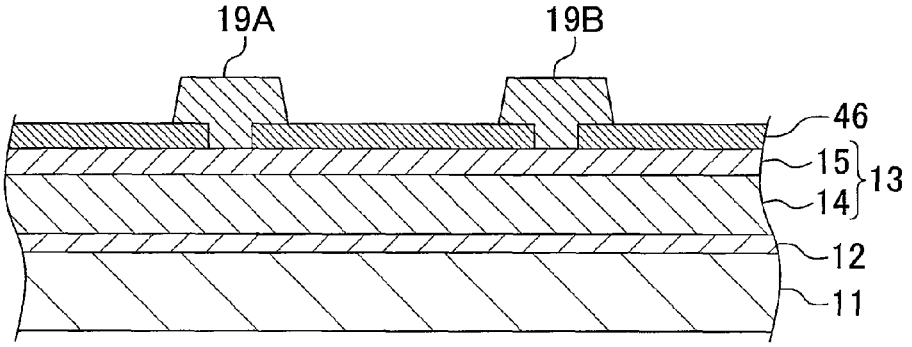

Then, as shown in FIG. 18(c), the first control layer 19A and the second control layer 19B of p-type GaN are formed in the openings 46a through a regrowth process. Then, electrodes, etc., may be formed by known methods.

In the semiconductor device of this variation, the first control layer 19A and the second control layer 19B are formed by a regrowth process. Therefore, a leak path will not be formed between the first control layer 19A and the second control layer 19B. Since the second semiconductor layer 15 is not etched, the second semiconductor layer 15 will not be damaged. Therefore, it is possible to suppress the occurrence of a current collapse due to a defect level.

Fifth Embodiment

Figure 19:
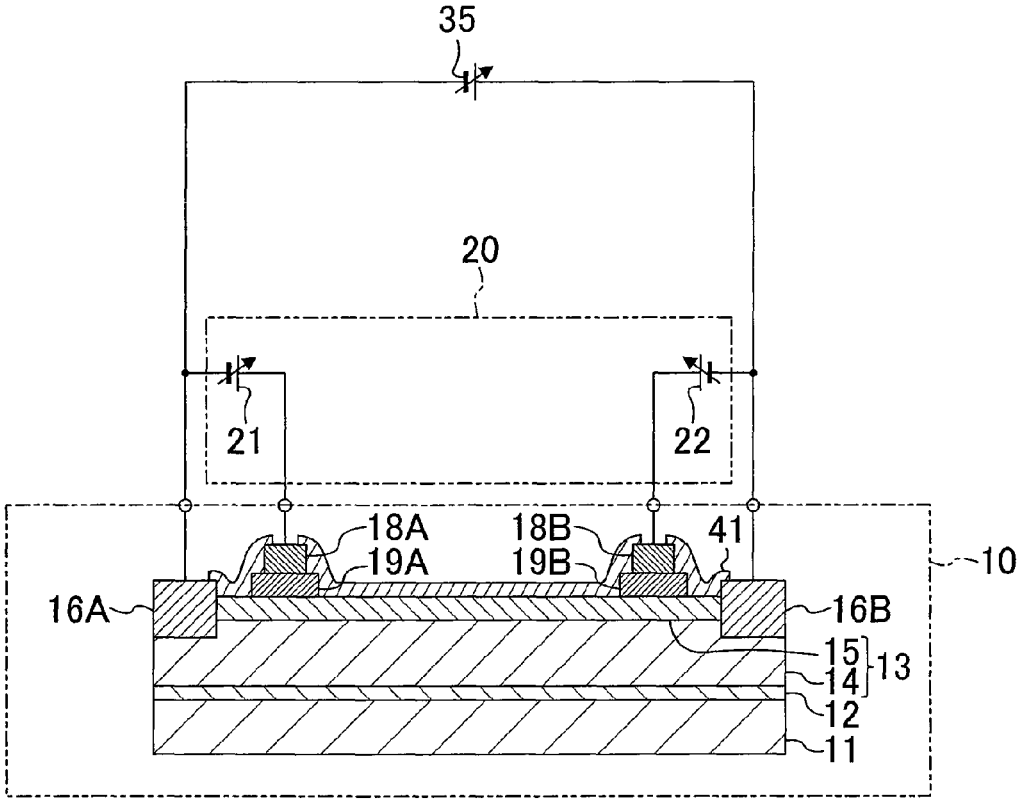
FIG. 19 A circuit diagram showing a semiconductor device according to a fifth embodiment of the present invention.

A fifth embodiment of the present invention will be described with reference to the drawings. FIG. 19 shows a configuration of a semiconductor device of the fifth embodiment. As shown in FIG. 19, the semiconductor device of the fifth embodiment is a bidirectional switch device, including a dual-gate semiconductor element 10 being a bidirectional switch product, and a control section 20 for operating the dual-gate semiconductor element 10 as a bidirectional switch.

The dual-gate semiconductor element shown in the first embodiment may be used for the semiconductor element 10. The dual-gate semiconductor elements shown in the fourth embodiment and variations thereof may also be used.

Specifically, the buffer layer 12 having a thickness of 1 μm, obtained by alternately layering aluminum nitride (AlN) having a thickness of 10 nm and gallium nitride (GaN) having a thickness of 10 nm, is formed on the substrate 11 of silicon (Si), and the semiconductor layer stack 13 is formed thereon. The semiconductor layer stack 13 includes the first semiconductor layer 14, and the second semiconductor layer 15 having a greater bandgap than the first semiconductor layer 14, layered in this order from the substrate side. In the present embodiment, the first semiconductor layer 14 is an undoped gallium nitride (GaN) layer having a thickness of 2 μm, and the second semiconductor layer 15 is an n-type aluminum gallium nitride (AlGaN) layer having a thickness of 20 nm.

Due to spontaneous polarization and piezopolarization, charges are generated near the heterojunction interface between the first semiconductor layer 14 and the second semiconductor layer 15. Thus, there is produced a channel region being a two-dimensional electron gas (2DEG) layer having a sheet carrier concentration of $1\times10^{13}$ $cm^{-2}$ or more and a mobility of 1000 $cm^2V/sec$ or more.

The first electrode 16A and the second electrode 16B are formed on the semiconductor layer stack 13 spaced apart from each other. The first electrode 16A and the second electrode 16B are obtained by layering together titanium (Ti) and aluminum (Al), and is in an ohmic contact with the channel region. FIG. 19 shows an example where portions of the second semiconductor layer 15 are removed and the first semiconductor layer 14 is dug down by about 40 nm so that the first electrode 16A and the second electrode 16B are in contact with the interface between the second semiconductor layer 15 and the first semiconductor layer 14, in order to reduce the contact resistance. Alternatively, the first electrode 16A and the second electrode 16B may be formed on the second semiconductor layer 15.

The first control layer 19A and the second control layer 19B being p-type semiconductor layers are selectively formed spaced apart from each other on the n-type second semiconductor layer 15 in the region between the first electrode 16A and the second electrode 16B. The first gate electrode 18A is formed on the first control layer 19A, and the second gate electrode 18B is formed on the second control layer 19B. The first gate electrode 18A and the second gate electrode 18B are obtained by layering together palladium (Pd) and gold (Au), and are in an ohmic contact with the first control layer 19A and the second control layer 19B, respectively.

The passivation film 41 of silicon nitride (SiN) is formed so as to cover the second semiconductor layer 15 and the first control layer 19A and the second control layer 19B. With the formation of the passivation film 41, it is possible to compensate for a defect that leads to a so-called "current collapse", thus improving the current collapse.

The first control layer 19A and the second control layer 19B are magnesium (Mg)-doped p-type GaN having a thickness of 300 nm. A pn junction is formed between the second semiconductor layer 15 and each of the first control layer 19A and the second control layer 19B. Thus, if the voltage between the first electrode and the first gate electrode is 0 V, for example, a depletion layer expands from the first p-type GaN layer into the channel region, whereby it is possible to block the current flow into the channel. Similarly, if the voltage between the second electrode and the second gate electrode is 0 V or less, for example, a depletion layer expands from the second p-type GaN layer into the channel region, whereby it is possible to block the current flow into the channel. Thus, there is realized a semiconductor element capable of a so-called "normally-off operation".

Assume that V1 denotes the potential of the first electrode 16A, V2 that of the first gate electrode 18A, V3 that of the second gate electrode 18B, and V4 that of the second electrode 16B. If V2 is higher than V1 by 1.5 V or more, the depletion layer expanding from the first control layer 19A into the channel region is shrunk, whereby it is possible to conduct a current through the channel region. Similarly, if V3 is higher than V4 by 1.5 V or more, the depletion layer expanding from the second control layer 19B into the channel region is shrunk, whereby it is possible to conduct a current through the channel region. Thus, a so-called "threshold voltage" of the first gate electrode 18A and that of the second gate electrode 18B are both 1.5 V. Hereinafter, a first threshold voltage is defined to be a threshold voltage of the first gate electrode such that the depletion layer expanding in the channel region below the second gate electrode 18A is shrunk so that a current can be conducted through the channel region, and a second threshold voltage is defined to be a threshold voltage of the second gate electrode such that the depletion layer expanding in the channel region below the second gate electrode 18B is shrunk so that a current can be conducted through the channel region.

The distance between the first control layer 19A and the second control layer 19B is designed so that the maximum voltage applied to the first electrode 16A and the second electrode 16B can be withstood.

The control section 20 includes a first power supply 21 connected between the first electrode 16A and the first gate electrode 18A, and a second power supply 22 connected between the second electrode 16B and the second gate electrode 18B. The first power supply 21 and the second power supply 22 used in the present embodiment are each a variable power supply whose output voltage can be varied.

A load circuit is connected between the first electrode 16A and the second electrode 16B. It is assumed in the following description that the load circuit is a variable power supply 35 connected between the first electrode 16A and the second electrode 16B.

An operation of the semiconductor device of the fifth embodiment will now be described. It is assumed for the purpose of illustration that the potential of the first electrode is 0 V, the output voltage of the first power supply 21 is Vg1, the output voltage of the second power supply 22 is Vg2, the voltage between the second electrode 16B and the first electrode 16A is $V_{S2S1}$, and the current flowing between the second electrode 16B and the first electrode 16A is $I_{S2S1}$. $V_{S2S1}$ corresponds to the drain voltage Vds of an ordinary FET, and $I_{S2S1}$ to the drain current Ids.

Where V4 is higher than V1, e.g., where V4 is +100 V and V1 is 0 V, the output voltages Vg1 and Vg2 of the first power supply 21 and the second power supply 22 are set to voltages less than or equal to the first threshold voltage and the second threshold voltage, respectively, e.g., 0 V. Then, the depletion layer expanding from the first control layer 19A expands through the channel region in the direction toward the second p-type GaN layer, whereby it is possible to block the current flowing through the channel. Thus, even if V4 is a positive high voltage, it is possible to realize a non-conductive state where the current flowing from the second electrode 16B to the first electrode 16A is blocked.

Also where V4 is lower than V1, e.g., where V4 is −100 V and V1 is 0 V, the depletion layer expanding from the second control layer 19B expands through the channel region in the direction toward the first control layer 19A, whereby it is possible to block the current flowing through the channel. Therefore, even if a negative high voltage is applied to the second electrode 16B, it is possible to block the current flowing from the first electrode to the second electrode. Thus, it is possible to block the current in both directions.

With the structure and operation as described above, the channel region for ensuring the breakdown voltage is shared by the first gate electrode and the second gate electrode. A conventional bidirectional switch product including two normally-off type AlGaN/GaN-HFETs and two diodes requires a channel region for the two AlGaN/GaN-HFETs and a channel region for the two diodes. However, with the present embodiment, it is possible to realize a bidirectional switch product with only the area of the channel region for one element. Thus, by using a dual-gate semiconductor element as the bidirectional switch product, the chip area can be reduced as compared with a case where two normally-off type AlGaN/GaN-HFETs and two diodes are used. Therefore, it is possible to reduce the cost and the size of the bidirectional switch device.

Where the output voltages Vg1 and Vg2 of the first power supply 21 and the second power supply 22 are higher than the first threshold voltage and the second threshold voltage, respectively, e.g., 5 V, the voltages applied to the first gate electrode 18A and the second gate electrode 18B are both higher than the threshold voltage. Therefore, the depletion layer does not expand from the first control layer 19A and the second control layer 19B into the channel region, whereby the channel region is not pinched off under the first gate electrode 18A or under the second gate electrode 18B. As a result, it is possible to realize a conductive state in which the current flows in both directions between the first electrode 16A and the second electrode 16B.

Figure 20A:
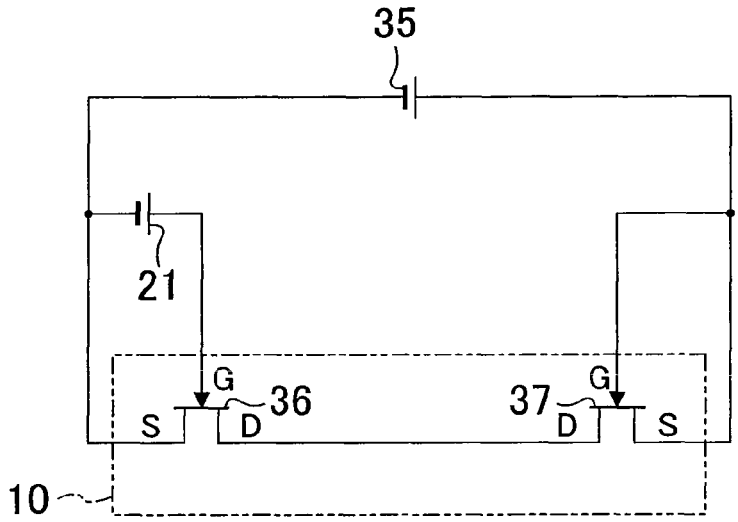
FIG. 20 Circuit diagrams showing an equivalent circuit of the semiconductor device according to the fifth embodiment of the present invention.

Next, an operation where Vg1 is a voltage higher than the first threshold voltage and Vg2 is less than or equal to the second threshold voltage will be described. In an equivalent circuit representation, the dual-gate semiconductor element 10 of the present embodiment can be regarded as a circuit including a first transistor 36 and a second transistor 37 connected together in series, as shown in FIG. 20(a). In this case, the source (S) of the first transistor 36 correspond to the first electrode 16A, the gate (G) of the first transistor 36 to the first gate electrode 18A, the source (S) of the second transistor 37 to the second electrode 16B, and the gate (G) of the second transistor 37 to the second gate electrode 18B.

Assume that Vg1 is 5 V and Vg2 is 0 V, for example, in such a circuit. Then, since Vg2 being 0 V is equivalent to a state where the gate and the source of the second transistor 37 are shorted with each other, the semiconductor element 10 can be regarded as a circuit shown in FIG. 20(b). Specifically, the semiconductor element 10 is equivalent to a transistor circuit in which the first electrode 16A is the source (S), the second gate electrode 18B is the gate (G) and the second electrode 16B is the drain (D), with the source (S) and the gate (G) being electrically connected with each other.

Figure 20B:
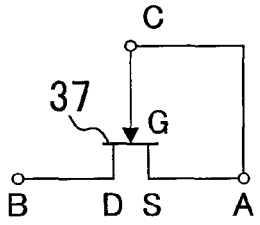

It is assumed in the following description that the source (S) of the transistor shown in FIG. 20(b) is the A terminal, the drain (D) is the B terminal, and the gate (G) is the C terminal.

If the potential of the B terminal is higher than the potential of the A terminal, it can be regarded as a transistor in which the A terminal is the source and the B terminal is the drain. Then, since the voltage between the C terminal (gate) and the A terminal (source) is 0 V, less than or equal to the threshold voltage, no current flows from the B terminal (drain) to the A terminal (source).

If the potential of the A terminal is higher than the potential of the B terminal, it can be regarded as a transistor in which the B terminal is the source and the A terminal is the drain. Then, since the C terminal (gate) and the A terminal (drain) are at the same potential, when the potential of the A terminal becomes greater than the threshold voltage with reference to the B terminal, a voltage greater than the threshold voltage with reference to the B terminal (source) is applied to the gate, whereby a current can be conducted from the A terminal (drain) to the B terminal (source).

Thus, when the gate and the source of the transistor are shorted with each other, the circuit functions as a diode in which the drain is the cathode and the source is the anode, with the threshold voltage of the transistor being the forward turn-ON voltage of the diode.

Figure 20C:
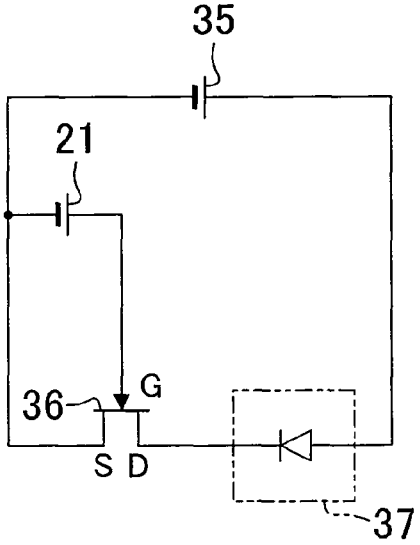

Therefore, a portion of the second transistor 37 shown in FIG. 20(a) can be regarded as a diode, and is represented as an equivalent circuit shown in FIG. 20(c). In the equivalent circuit shown in FIG. 20(c), if the potential of the second electrode of the bidirectional switch product is higher than the potential of the first electrode, since 5 V is being applied to the gate of the first transistor 36, the first transistor 36 is ON, and a current can be conducted from the drain to the source. However, there occurs an ON voltage due to the forward turn-ON voltage of the diode. If the potential of the fist electrode of the bidirectional switch element is higher than the potential of the second electrode, the diode including the second transistor 37 bears the voltage, thus blocking the current flow from the first electrode to the second electrode of the bidirectional switch element. Thus, it is possible to realize a bidirectional switch capable of a so-called "reverse-blocking operation" by giving a voltage greater than the threshold voltage to the first gate and giving a voltage less than or equal to the threshold voltage to the second gate.

Figure 21A:
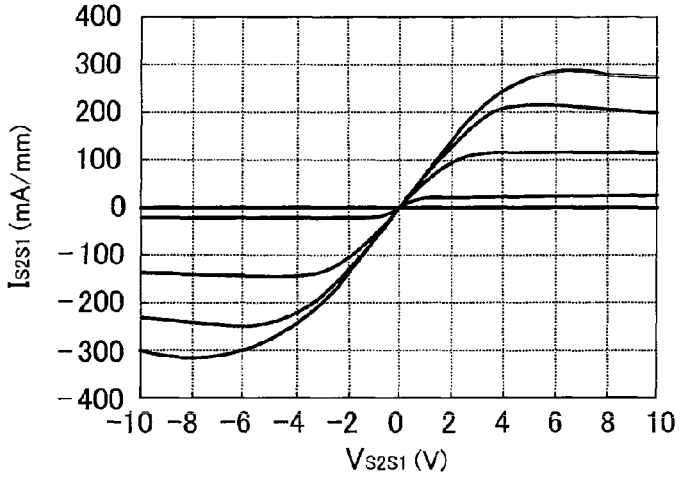
FIG. 21 Graphs each showing current-voltage characteristics of the semiconductor device according to the fifth embodiment of the present invention.
Figure 21B:
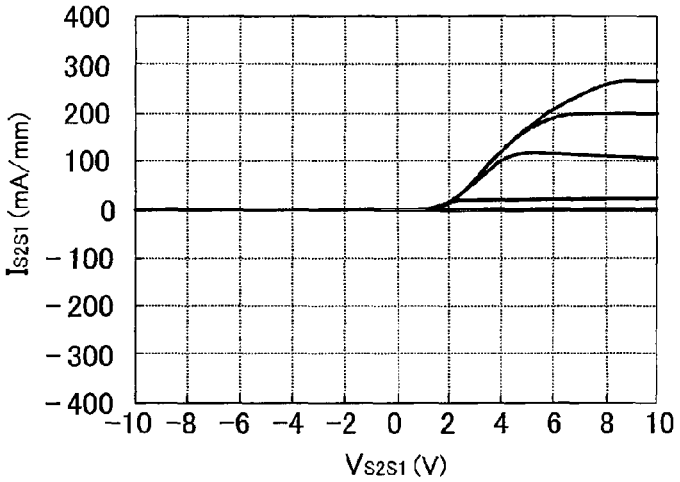
Figure 21C:
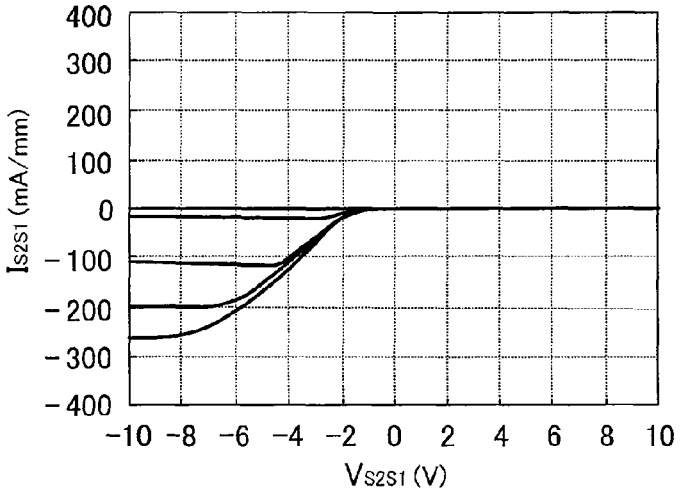

FIG. 21 chows the relationship between the voltage $V_{S2S1}$ between the second electrode 16B and the first electrode 16A of the semiconductor element 10 and the current $I_{S2S1}$ flowing from the second electrode 16B to the first electrode 16A, wherein FIG. 21(a) shows a case where Vg1 and Vg2 are both varied, FIG. 21(b) shows a case where Vg1 is varied while Vg2 is set to 0 V (less than or equal to the second threshold voltage), and FIG. 21(c) shows a case where Vg2 is varied while Vg1 is set to 0 V (less than or equal to the first threshold voltage). $V_{S2S1}$ along the horizontal axis in FIG. 21 is a voltage with respect to the first electrode 16A, and $I_{S2S1}$ along the vertical axis is plotted assuming the positive direction is the direction of a current flow from the second electrode 16B toward the first electrode 16A.

As shown in FIG. 21(a), when Vg1 and Vg2 are 0 V or 1 V, $I_{S2S1}$ does not flow whether $V_{S2S1}$ is positive or negative, whereby the semiconductor element 10 is in a non-conductive state. When Vg1 and Vg2 are both higher than the threshold voltage, a conductive state is reached where $I_{S2S1}$ flows in both directions according to $V_{S2S1}$.

As shown in FIG. 21(b) , where Vg2 is set to 0 V (less than or equal to the second threshold voltage), and where Vg1 is set to 0 V (less than or equal to the first threshold voltage), $I_{S2S1}$ is blocked in both directions. Where Vg1 is set to 2 V to 5 V (greater than or equal to the first threshold voltage), $I_{S2S1}$ does not flow when $V_{S2S1}$ is less than 1.5 V, but $I_{S2S1}$ flows when $V_{S2S1}$ is greater than or equal to 1.5 V. Thus, a reverse-blocking state is reached where a current flows only from the second electrode 16B to the first electrode 16A, but not from the first electrode 16A to the second electrode 16B. Where Vg2 is varied while Vg1 is set to 0 V, as shown in FIG. 21(c), a reverse-blocking state is reached where a current flows only from the first electrode 16A to the second electrode 16B, but not from the second electrode 16B to the first electrode 16A.

As described above, depending on the gate bias conditions, the semiconductor element 10 can function as a bidirectional switch product blocking/conducting the current in both directions or as a bidirectional switch product capable of a reverse-blocking operation in which the bidirectional switch product performs an operation of conducting the current only in one direction and an operation of blocking the current in both directions. The direction of the current conduction of the reverse-blocking characteristics can also be switched.

The present embodiment is directed to a case where the threshold voltages of the first gate and the second gate are 1.5 V. However, the threshold voltages of the first gate and the second gate can be adjusted by changing the thickness and the Al composition of the AlGaN layer and the acceptor concentration of the p-type GaN layer. The threshold voltages of the first gate and the second gate are preferably about 0 V to 3 V.

Sixth Embodiment

Figure 22:
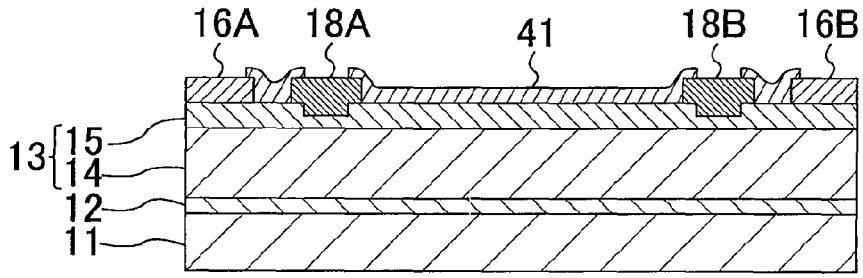
FIG. 22 A cross-sectional view showing semiconductor elements used in a semiconductor device according to a sixth embodiment of the present invention.

A sixth embodiment of the present invention will now be described with reference to the drawings. FIG. 22 shows a cross section of a semiconductor element used in a semiconductor device of the sixth embodiment. In FIG. 22, like elements to those of FIG. 19 are denoted by like reference numerals and will not be further described below.

In the semiconductor element 10 of the present embodiment, the buffer layer 12 having a thickness of 1 μm, obtained by alternately layering MN having a thickness of 10 nm and GaN having a thickness of 10 nm, is formed on the substrate 11 of Si, and the semiconductor layer stack 13 is formed thereon. The semiconductor layer stack 13 includes the undoped first semiconductor layer 14 having a thickness of 2 μm and the n-type second semiconductor layer 15 having a thickness of 50 nm layered in this order from the bottom.

The first electrode 16A and the second electrode 16B are formed on the semiconductor layer stack 13 spaced apart from each other. The first electrode 16A and the second electrode 16B are obtained by layering together titanium (Ti) and aluminum (Al), and is in an ohmic contact with the channel region. The present embodiment is directed to an example where the first electrode 16A and the second electrode 16B are formed on the second semiconductor layer 15. However, as in the fifth embodiment, portions of the second semiconductor layer 15 may be removed and the first semiconductor layer 14 may be dug down by about 40 nm so that the first electrode 16A and the second electrode 16B are in contact with the interface between the second semiconductor layer 15 and the first semiconductor layer 14.

In a region of the second semiconductor layer 15 between the first electrode 16A and the second electrode 16B, there are two depressed portions (recesses) having a depth of 40 nm, and the first gate electrode 18A and the second gate electrode 18B are formed so as to fill the depressed portions. The first gate electrode 18A and the second gate electrode 18B are obtained by layering together palladium (Pd) and gold (Au), and are forming a Schottky junction with the second semiconductor layer 15.

In the semiconductor element 10 of the present embodiment, the first gate electrode 18A and the second gate electrode 18B are formed in the depressed portions in the second semiconductor layer 15. Therefore, the second semiconductor layer 15 has a smaller thickness under the first gate electrode 18A and the second gate electrode 18B than in the other portions. Thus, the threshold voltages of the first gate electrode 18A and the second gate electrode 18B can be shifted in the positive direction. Therefore, it is possible to realize the dual-gate semiconductor element 10 of a normally-off type. With field effect transistors in which AlGaN and GaN are layered together, the current collapse occurring due to traps formed in the surface of the AlGaN layer has been a problem. With the semiconductor element 10 of the present embodiment, however, the surface of the AlGaN layer is away from the channel region, thereby providing an advantage that the current collapse can be reduced.

While the first gate electrode 18A and the second gate electrode 18B are formed to be in contact with the AlGaN layer in the semiconductor device chown in FIG. 22, they may be formed over the AlGaN layer with an insulating film therebetween. In such a case, the insulating film is preferably silicon nitride (SiN), silicon oxide ($SiO_2$), hafnium oxide ($HfO_2$), alumina ($Al_2O_3$), or tantalum oxide ($Ta_2O_5$), or the like.

While the first gate electrode 18A and the second gate electrode 18B are formed so as to cover the top of the second semiconductor layer 15 around the depressed portions in the illustrated example, the first gate electrode 18A and the second gate electrode 18B do not need to cover the top of the second semiconductor layer 15.

The present embodiment is directed to an example where the AlGaN layer is thinned by the provision of the depressed portions therein directly under the first gate electrode and the second gate electrode, thereby realizing a normally-off operation. However, a normally-off operation may also be realized by thinning the AlGaN layer across the entire extent thereof. With such a structure, the process of forming the depressed portions is no longer necessary, whereby it is possible to produce the element with fewer steps and thus to reduce the cost.

With the semiconductor element of the present embodiment, the threshold voltage can be adjusted by changing the thickness and the Al composition of AlGaN layer and the material of the gate electrodes. In order to realize a bidirectional switch product capable of a normally-off operation, the threshold voltage is preferably 0 V to 1 V.

Seventh Embodiment

Figure 23:
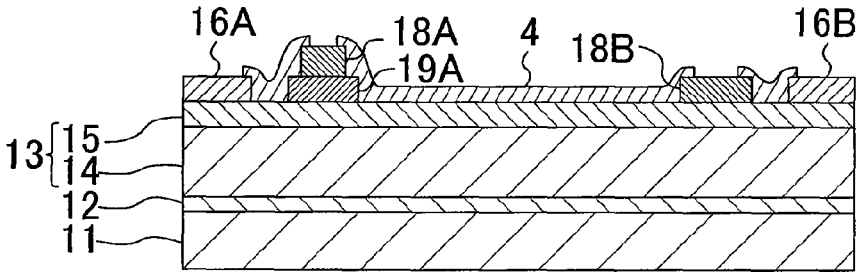
FIG. 23 A cross-sectional view showing semiconductor elements used in a semiconductor device according to a seventh embodiment of the present invention.

A seventh embodiment of the present invention will now be described with reference to the drawings. FIG. 23 shows a cross section of a semiconductor element used in a semiconductor device of the seventh embodiment. In FIG. 23, like elements to those of FIG. 19 are denoted by like reference numerals and will not be further described below.

In the semiconductor element 10 of the present embodiment, the buffer layer 12 having a thickness of 1 μm, obtained by alternately layering AlN having a thickness of 10 nm and GaN having a thickness of 10 nm, is formed on the substrate 11 of Si, and the semiconductor layer stack 13 is formed thereon. The semiconductor layer stack 13 includes the undoped first semiconductor layer 14 having a thickness of 2 μm and the n-type second semiconductor layer 15 having a thickness of 50 nm layered in this order from the bottom.

The first electrode 16A and the second electrode 16B are formed on the semiconductor layer stack 13 spaced apart from each other. The first electrode 16A and the second electrode 16B are obtained by layering together titanium (Ti) and aluminum (Al), and is in an ohmic contact with the channel region. The present embodiment is directed to an example where the first electrode 16A and the second electrode 16B are formed on the second semiconductor layer 15. However, as in the fifth embodiment, portions of the second semiconductor layer 15 may be removed and the first semiconductor layer 14 may be dug down by about 40 nm so that the first electrode 16A and the second electrode 16B are in contact with the interface between the second semiconductor layer 15 and the first semiconductor layer 14.

The first gate electrode 18A and the second gate electrode 18B are formed in this order from the first electrode 16A, and spaced apart from each other, on the second semiconductor layer 15 in the region between the first electrode 16A and the second electrode 16B. The first gate electrode 18A is formed on the first control layer 19A, which is selectively formed on the second semiconductor layer 15, whereas the second gate electrode 18B is formed in contact with the second semiconductor layer 15. The first gate electrode 18A and the second gate electrode 18B are obtained by layering together palladium (Pd) and gold (Au), and the first gate electrode 18A is forming an ohmic junction with the first control layer 19A. The first control layer 19A is magnesium (Mg)-doped p-type GaN having a thickness of 300 nm.

The first control layer 19A and the second semiconductor layer 15 together form a pn junction therebetween. Therefore, if the voltage between the first electrode 16A and the first gate electrode 18A is 0 V, for example, a depletion layer expands from the first control layer 19A into the channel region, thereby blocking the current flow through the channel. Thus, the first threshold voltage is about 1.5 V (see Yasuhiro Uemoto, et al., "IEICE Technical Report", The Institute of Electronics, Information and Communication Engineers, 2007, vol. 106, no. 459, pp. 193-197).

On the other hand, the second gate electrode 18B and the second semiconductor layer 15 together form a Schottky junction therebetween. Therefore, if the voltage between the second electrode 16B and the second gate electrode 18B is 0 V, for example, a depletion layer expands into the channel region, thereby blocking the current flow through the channel. Thus, the threshold voltage of the second gate electrode 18B is 0 V (see Ken Nakata, et al., "IEICE Technical Report", The Institute of Electronics, Information and Communication Engineers, 2005, vol. 105, no. 325, pp. 51-56). Note however that the composition ratio between Al and Ga of the second semiconductor layer 15 is adjusted so that the second threshold voltage is 0 V.

With a semiconductor device such that the first threshold voltage is 1.5 V and the second threshold voltage is 0 V, as described above, the ON voltage, which occurs when there is a forward current flow in a reverse-blocking operation, can be set to 0 V. Therefore, it is possible to form a dual-gate semiconductor device having an even lower resistance.

Figure 24:
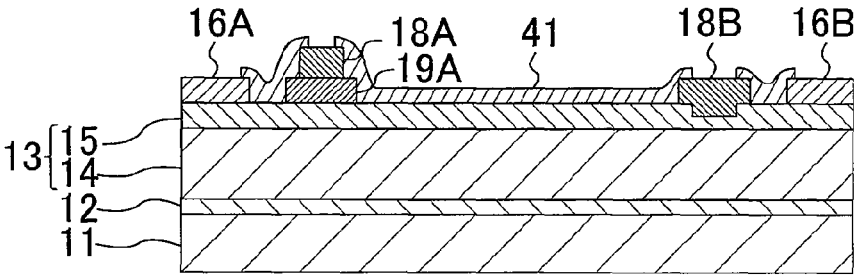
FIG. 24 A cross-sectional view showing a variation of the semiconductor elements used in the semiconductor device according to the seventh embodiment of the present invention.

As a method for setting the second threshold voltage to 0 V, a depressed portion may be formed in the second semiconductor layer 15 and the second gate electrode 18B may be formed so as to fill the depressed portion, as shown in FIG. 24. With such a structure, the threshold voltage of the second gate electrode 18B can be set to 0 V without decreasing the Al composition of the second semiconductor layer 15. Thus, it is possible to set the threshold voltage of the second gate electrode 18B to 0 V while maintaining high sheet carrier concentration (see Non-Patent Document 2). The threshold voltage of the second gate is not necessarily 0 V, but is preferably set in the range of 0 V to 1 V.

While the second gate electrode 18B is formed so as to cover the top of the second semiconductor layer 15 around the depressed portion in the illustrated example, the second gate electrode 18B does not need to cover the top of the second semiconductor layer 15.

The fifth to seventh embodiments are directed to examples of 4-terminal bidirectional switch products. However, when only the reverse-blocking operation is required for the bidirectional switch product to be produced, the second gate electrode and the second electrode may be electrically connected with each other by a wire of Au, or the like. With such a configuration, it is possible to form a 3-terminal bidirectional switch product capable only of a reverse-blocking operation. Such a 3-terminal element can be treated in a similar manner to a conventional transistor, thereby eliminating the need for a driving circuit and a power supply for biasing the second gate electrode.

While the reverse-blocking operation of a bidirectional switch product has been described in the fifth to seventh embodiments, this operation is the same as a diode operation, and therefore the bidirectional switch product is required to have a similar high-speed switching characteristic to that required of a diode. The switching characteristic of a diode refers to the capability of quickly switching from the current-conductive state to the non-conductive state upon switching of the polarity of the applied voltage. With a typical pn junction diode, when the polarity of the voltage applied across the diode is switched while conducting a current from the anode to the cathode, the diode momentarily conducts a current from the cathode to the anode and then blocks the current flow from the cathode to the anode after the passage of a predetermined period of time. Generally, this characteristic is called the "recovery characteristic", the predetermined period of time before the current flow from the cathode to the anode is blocked is called the "recovery time", and the current momentarily conducted from the cathode to the anode is called the "recovery current".

Typically, the recovery current of a pn junction diode occurs as follows. When the minority carrier injected during the current-conducting period due to the minority carrier storage effect is discharged in the reverse bias period, the minority carrier is discharged as a reverse current against the diode's rectification function.

The recovery current of a diode can be reduced by reducing the minority carrier being the cause of the problem, and this can be done by forming a diode without a pn junction. For example, with a Schottky barrier diode in which the diode is formed based on the Schottky barrier, the recovery current is small because the electrons are the only carrier.

In the reverse-blocking operation of the bidirectional switch products of the fifth to seventh embodiments, a current is not flowing through the second gate electrode, but the electrical conduction from the second electrode to the first electrode is done via the channel region formed by a two-dimensional electron gas. In other words, it operates as a diode without passing through a p-type semiconductor and there is no parasitic structure such as a parasitic diode, whereby there is no minority carrier storage effect. As a result, the recovery current is smaller than that of a pn junction diode, and the recovery time is shorter.

Eighth Embodiment

Figure 25:
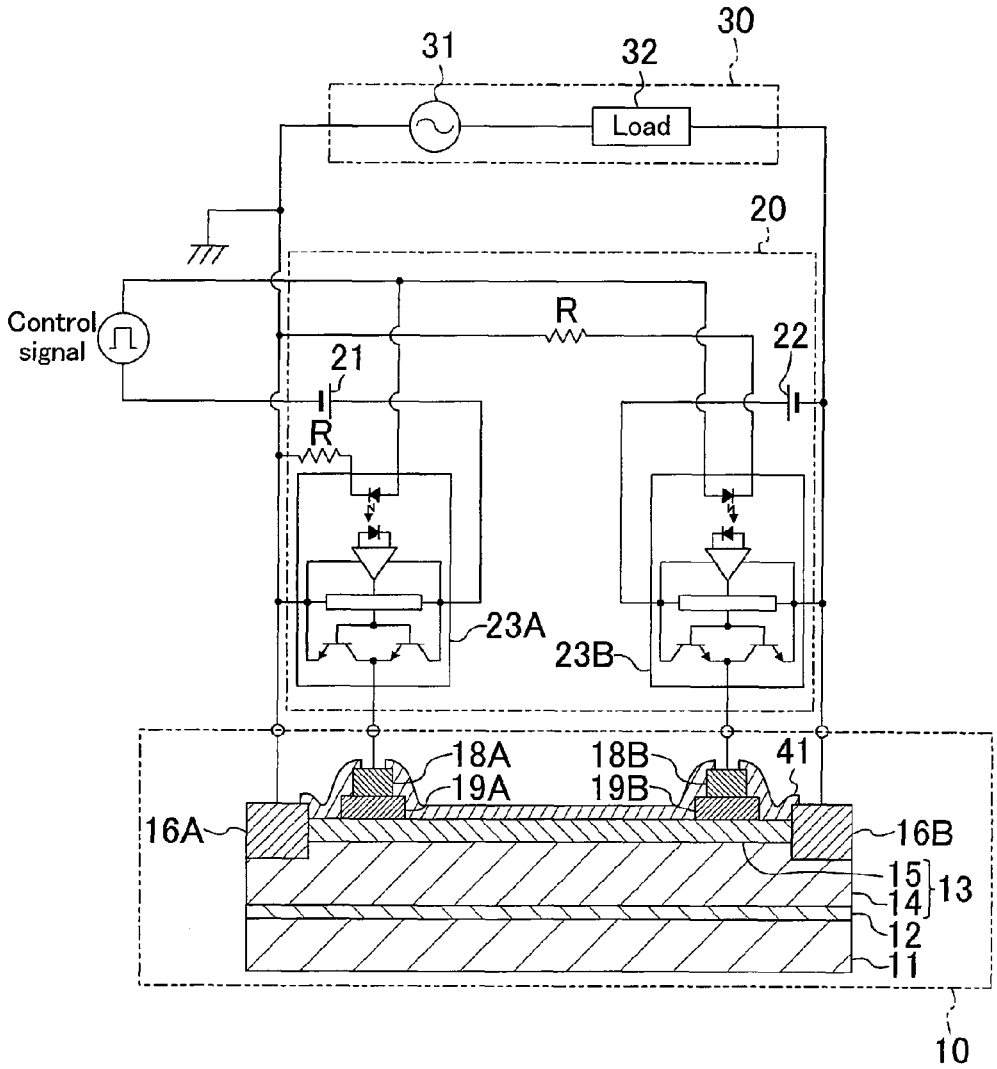
FIG. 25 A circuit diagram showing a semiconductor device according to an eighth embodiment of the present invention.

An eighth embodiment of the present invention will now be described with reference to the drawings. FIG. 25 shows a configuration of a semiconductor device of the eighth embodiment. In FIG. 25, like elements to those of FIG. 19 are denoted by like reference numerals and will not be further described below.

As shown in FIG. 25, in the semiconductor device of the present embodiment, the control section 20 includes the first power supply 21 connected to the first gate electrode 18A via a first switch circuit 23A, and the second power supply 22 connected to the second gate electrode 18B via a second switch circuit 23B.

The first switch circuit 23A and the second switch circuit 23B each include a photocoupler, including a light emitting diode (LED) and a photodiode, and can be switched ON/OFF by an external control signal, and the control signal and the switch output can be electrically separated from each other. FIG. 25 shows an example where an integrated circuit including a gate driving circuit therein is used for the first switch circuit 23A and the second switch circuit 23B. The integrated circuit may be any of those commercially available, and may be, for example, Photocoupler TLP251 from Toshiba Corporation. Moreover, it is not limited to an integrated circuit including a gate driving circuit therein, but may be any circuit as long as it is a switch capable of electrically separating the control signal and the switch output from each other.

In the present embodiment, the voltages of the first power supply 21 and the second power supply 22 are set to be higher than the threshold voltages of the first gate electrode 18A and the second gate electrode 18B. The second power supply 22 is a power supply that is insulated from a load power supply 31 such as an insulated battery or an insulated-type voltage converter (DC-DC converter). Thus, the second gate electrode is driven by a driving signal having a reference potential being different from the common reference potential (ground potential) of the circuit.

An operation of the semiconductor device of the eighth embodiment will now be described. When the first switch circuit 23A and the second switch circuit 23B are turned ON by an external control signal, the first power supply 21 and the first gate electrode 18A are connected with each other, and the second power supply 22 and the second gate electrode 18B are connected with each other. Thus, since a voltage higher than the threshold voltage is applied to the first gate electrode 18A and the second gate electrode 18B, the current flow in both directions between the first electrode 16A and the second electrode 16B.

When the first switch circuit 23A and the second switch circuit 23B are turned OFF by the control signal, the first gate electrode 18A and the second gate electrode 18B are cut off from the first power supply 21 and the second power supply 22, respectively. Then, a potential equal to the first electrode 16A is applied to the first gate electrode 18A, and a potential equal to the second electrode 16B is applied to the second gate electrode 18B. Where the potential of the second electrode 16B is +100 V and that of the first electrode 16A is 0 V, the potential of the first gate electrode 18A is 0 V (less than or equal to the first threshold voltage), whereby the channel region is pinched off under the first gate electrode 18A, and no current flows from the second electrode 16B to the first electrode 16A. Also where the potential of the second electrode 16B is −100 V and that of the first electrode 16A is 0 V, the voltage between the second gate electrode 18B and the second electrode 16B is 0 V (less than or equal to the second threshold voltage). Therefore, no current flows from the first electrode 16A to the second electrode 16B.

Ninth Embodiment

Figure 26:
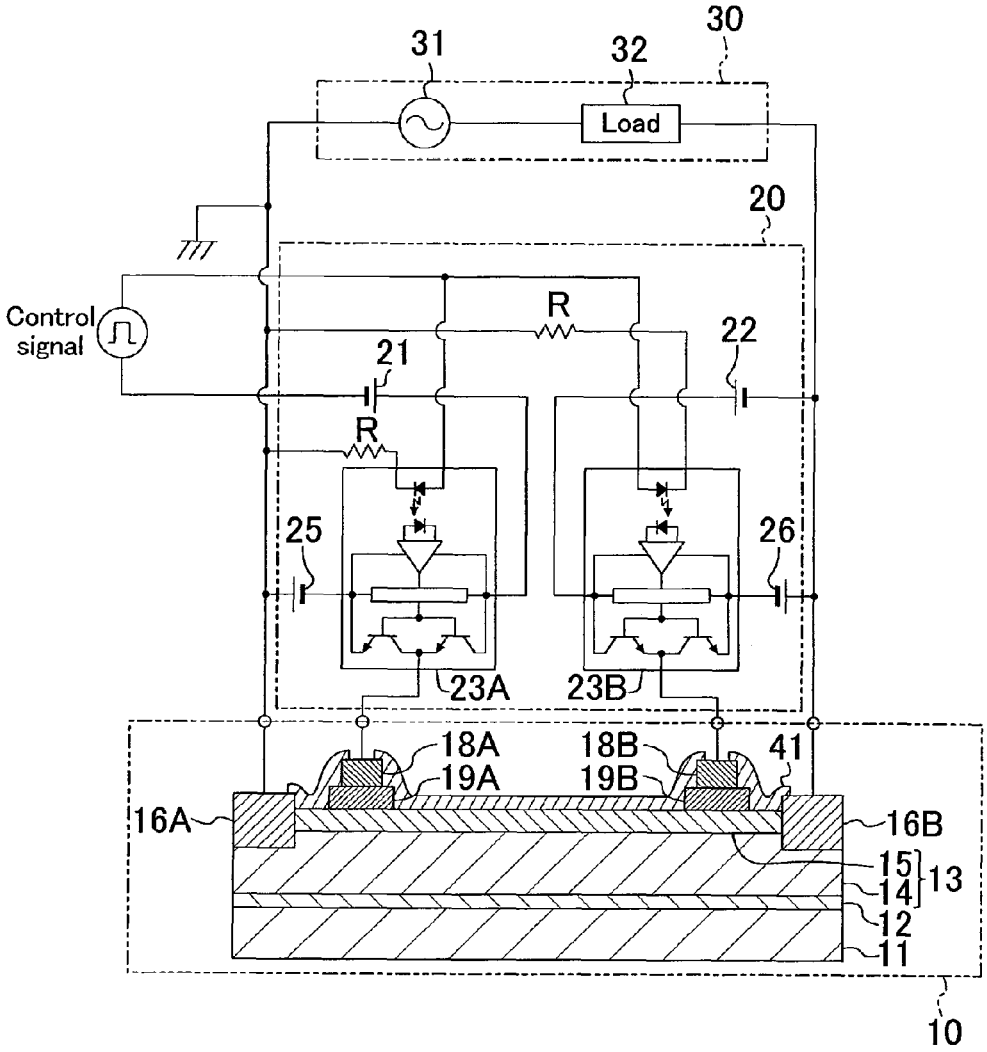
FIG. 26 A circuit diagram showing a semiconductor device according to a ninth embodiment of the present invention.

A ninth embodiment of the present invention will now be described with reference to the drawings. FIG. 26 shows a configuration of a semiconductor device of the ninth embodiment. In FIG. 26, like elements to those of FIG. 25 are denoted by like reference numerals and will not be further described below.

In the semiconductor device of the present embodiment, the control section 20 includes a third power supply 25 connected on the opposite side of the first switch circuit 23A with respect to the first power supply 21, and a fourth power supply 26 connected on the opposite side of the second switch circuit 23B with respect to the second power supply 22. The voltage of the first power supply 21 and the second power supply 22 is 5 V, for example, and the voltage of the third power supply 25 and the fourth power supply 26 is set to 3 V, for example The second power supply 22 and the fourth power supply 26 are power supplies insulated from the load power supply 31.

In the present embodiment, when the first switch circuit 23A and the second switch circuit 23B are turned ON by the control signal, the first gate electrode 18A and the first power supply 21 are connected with each other, and the second gate electrode 18B and the second power supply 22 are connected with each other, as in the eighth embodiment. When the first switch circuit 23A and the second switch circuit 23B are turned OFF, the first gate electrode 18A and the third power supply 25 are connected with each other, and the second gate electrode 18B and the fourth power supply 26 are connected with each other. Therefore, −3 V is applied to the first gate electrode 18A and the second gate electrode 18B. Thus, the gap between the first electrode 16A and the second electrode 16B can be blocked more completely, thereby reducing the leak current and thus reducing the amount of power consumed by the semiconductor device.

Although the eighth and ninth embodiments are directed to examples where the first electrode is grounded, it is not necessary that the first electrode is grounded. In such a case, however, the gate-control power supply connected to the first electrode is insulated from the ground of the load circuit. Specifically, a battery, an insulated-type DC-DC converter, an insulated-type power supply using a charge pump circuit, or the like, may be used.

Tenth Embodiment

Figure 27:
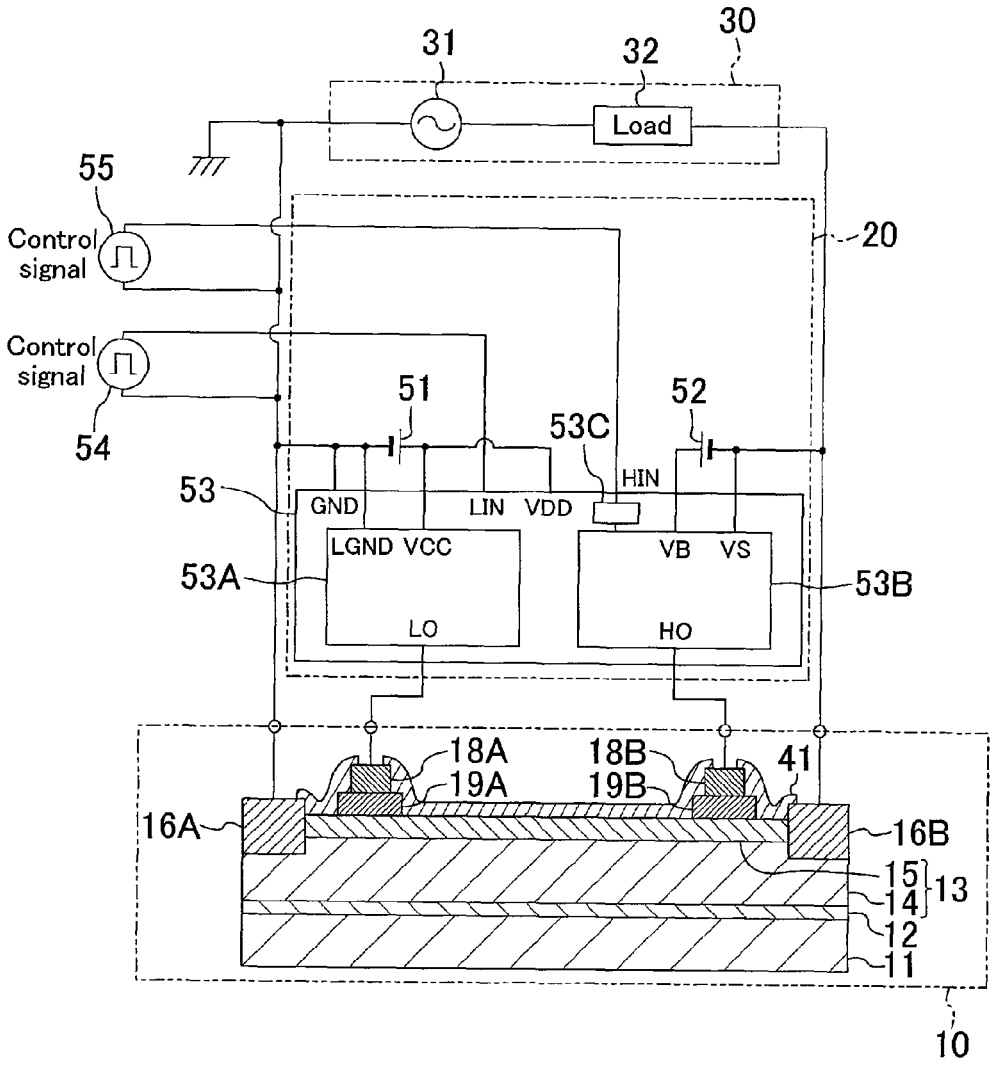
FIG. 27 A circuit diagram showing a semiconductor device according to a tenth embodiment of the present invention.

A tenth embodiment of the present invention will now be described with reference to the drawings. FIG. 27 shows a configuration of a semiconductor device of the tenth embodiment. In FIG. 27, like elements to those of FIG. 19 are denoted by like reference numerals and will not be further described below.

As shown in FIG. 27, in the semiconductor device of the present embodiment, the control section 20 includes a driver element 53 including a gate driving circuit called an "HVIC (High Voltage Integrated Circuit)" therein, a first power supply 51, and a second power supply 52. The first power supply 51 and the second power supply 52 output voltages greater than or equal to the threshold voltages of the first gate electrode 18A and the second gate electrode 18B, e.g., 5 V. The driver element 53 used in the control section 20 includes a low-side gate driving circuit 53A used on the low-voltage side, and a high-side gate driving circuit 53B used on the high-voltage side.

Typically, in order to transmit the control signal to the gate driving circuit connected on the high-voltage side, it is necessary to electrically insulate the control signal by using a photocoupler, an insulated transformer, or the like. However, since an HVIC transmits the control signal to the high-side gate driving circuit 53B by means of a level shift circuit 53C, it is not necessary to use a photocoupler, an insulated transformer, or the like, and it is possible to reduce the size and the cost of the device.

In the driver element 53 used in the present embodiment, the low-side gate driving circuit 53A is driven by a signal input to the low-side input terminal LIN. When a low-level signal (e.g., 0 V) is input to the input terminal LIN, the low-side output terminal LO and the low-side terminal ground LGND are connected with each other, and the output terminal LO and the low-side bias power supply terminal VCC are insulated from each other. When a high-level signal (e.g., 5 V) is input to the input terminal LIN, the output terminal LO and the terminal ground LGND are insulated from each other, and the output terminal LO and the bias power supply terminal VCC are connected with each other.

The signal input to the high-side input terminal HIN is transmitted to the high-side gate driving circuit 53B via the level shift circuit 53C to drive the high-side gate driving circuit 53B. When a low-level signal is input to the input terminal HIN, the high-side output terminal HO and the high-side offset terminal VS are connected with each other, and the output terminal HO and the high-side bias power supply terminal VB are insulated from each other. When a high-level signal is input to the input terminal HINT, the output terminal HO and the offset terminal VS are insulated from each other, and the output terminal HO and the bias power supply terminal VB are connected with each other.

With the signal transmission via the level shift circuit 53C, it is possible to transmit the control signal to the high-side gate driving circuit operating with respect to a reference potential that is different from the ground potential, which is the common reference potential. Thus, the high-side control signal output from the output terminal HO is a driving signal whose reference potential is different from the ground potential.

In the semiconductor device of the present embodiment, the low-side input terminal LIN receives a first control signal supplied from a first signal source 54, and the output terminal LO is connected to the first gate electrode 18A of the semiconductor element 10. The first power supply 51 is connected between the ground terminal GND and the power supply terminal VDD of the driver element 53 and between the low-side terminal ground LGND and the low-side bias power supply terminal VCC, and the ground terminal GND and the terminal ground LGND are connected to the first electrode 16A. In the present embodiment, the low level and the high level of the first control signal and the second control signal are, for example, 0 V and 5 V, respectively.

If the first control signal is at the low level, the first gate electrode 18A and the first electrode 16A are shorted with each other, and if the first control signal is at the high level, the first power supply 51 applies a voltage greater than or equal to the threshold voltage of the first gate electrode 18A between the first gate electrode 18A and the first electrode 16A.

On the other hand, the high-side input terminal HIN receives a second control signal supplied from a second signal source 55, and the output terminal HO is connected to the second gate electrode 18B. The second power supply 52 is connected between the high-side offset terminal VS and the high-side bias power supply terminal VB, and the offset terminal VS is connected to the second electrode 16B. The second power supply 52 is an insulated-type power supply electrically insulated from the potential of the first electrode 16A.

Therefore, if the second control signal is at the low level, the second gate electrode 18B and the second electrode 16B are shorted with each other, and if the second control signal is at the high level, the second power supply 52 applies a voltage greater than or equal to the threshold voltage of the second gate electrode 18B between the second gate electrode 18B and the second electrode 16B.

Therefore, a non-conductive state where no current flows between the first electrode 16A and the second electrode 16B can be realized by setting the first control signal and the second control signal to the low level. A conductive state where the current flows in both directions between the first electrode 16A and the second electrode 16B can be realized by setting the first control signal and the second control signal to the high level. A reverse-blocking state where the current flows from the first electrode 16A to the second electrode 16B but not from the second electrode 16B to the first electrode 16A can be realized by setting the first control signal to the low level and the second control signal to the high level. A reverse-blocking state where the current flows from the second electrode 16B to the first electrode 16A but not from the first electrode 16A to the second electrode 16B can be realized by setting the first control signal to the high level and the second control signal to the low level.

In the semiconductor device of the present embodiment, the driver element 53 being an HVIC is used for the control section 20, it is possible to eliminate the need for a photocoupler, an insulated transformer, or the like, for transmitting the control signal to the high-side driver circuit. Therefore, it is possible to reduce the size and the cost of the control section 20. An HVIC in which the high-side driver circuit is separated by a dielectric is used as the driver element 53.

The level shift circuit it is a circuit that includes a transformer that can be integrated into an IC and transmits signals via the transformer so as to electrically insulate the input signal and the output signal from each other. A specific example known in the art is ADum5240, an IC from Analog Devices, Inc.

Eleventh Embodiment

Figure 28:
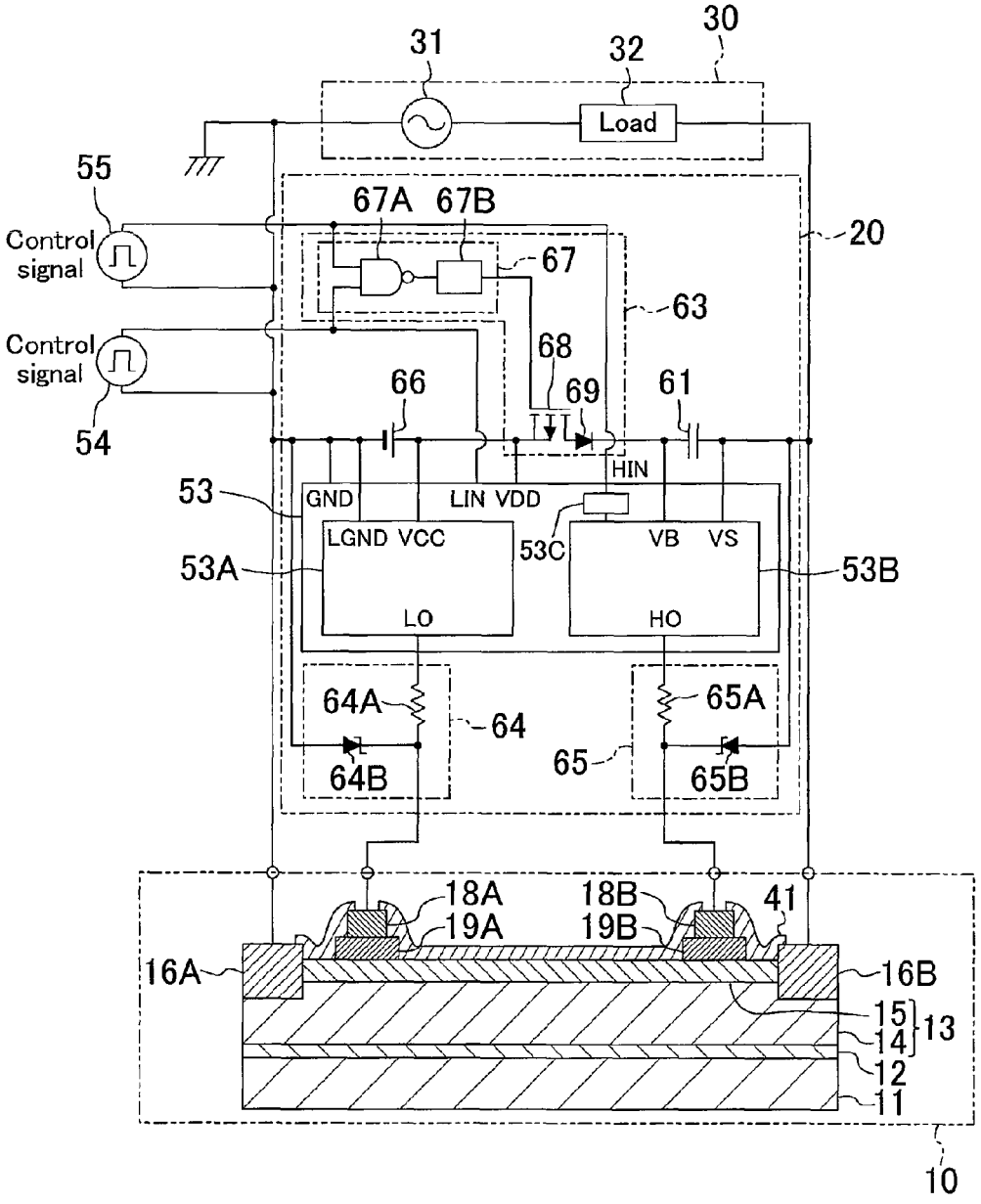
FIG. 28 A circuit diagram showing a semiconductor device according to an eleventh embodiment of the present invention.

An eleventh embodiment of the present invention will now be described with reference to the drawings. FIG. 28 shows a configuration of a semiconductor device of the eleventh embodiment. In FIG. 28, like elements to those of FIG. 27 are denoted by like reference numerals and will not be further described below.

As shown in FIG. 28, in the semiconductor device of the present embodiment, the control section 20 includes a capacitor 61 instead of the second power supply, and the control section 20 includes a charging circuit 63 for charging the capacitor 61, and a first step-down circuit 64 and a second step-down circuit 65 for bringing the output of the low-side output terminal LO and the output of the high-side output terminal HO, respectively, to be less than or equal to a predetermined voltage.

The charging circuit 63 includes a charging switch circuit, and a logic circuit 67 for driving the charging switch circuit. The charging switch circuit includes a diode 69 connected in series between a driver power supply 66 and the capacitor 61, and a semiconductor switch 68 being a p-channel MOSFET. The threshold voltage of the p-channel MOSFET being the semiconductor switch 68 is −3 V, for example. The logic circuit 67 includes an exclusive logical product (NAND) gate circuit 67A, and a delay circuit 67B. The output of the logic circuit 67 goes to the low level with a delay time set by the delay circuit 67B after the first control signal and the second control signal both become the high level, and goes to the high level with the delay time after at least one of the first control signal and the second control signal becomes the low level.

The first step-down circuit 64 includes a resistor 64A and a Zener diode 64B, and limits the output of the output terminal LO to be less than or equal to the breakdown voltage of the Zener diode 64B. The second step-down circuit 65 includes a resistor 65A and a Zener diode 65B, and limits the output of the output terminal HO to be less than or equal to the breakdown voltage of the Zener diode 65B. The breakdown voltage of the Zener diode 64B and the Zener diode 65B may be set to be less than or equal to a voltage such that the transistor will not be broken by the overcurrent flowing into the first gate electrode and the second gate electrode of the semiconductor element 10, e.g., 5 V.

In the present embodiment, the driver power supply 66 outputs a voltage greater than or equal to the threshold voltage of the first gate electrode 18A, e.g., 10 V. The high level of the first control signal and the second control signal is set to 10 V, being equal to the output of the driver power supply 66, and the low level thereof is set to 0 V.

An operation of the semiconductor device of the present embodiment will now be described. First, when the first control signal and the second control signal go to the high level, the voltage between the output terminal LO and the first electrode 16A becomes 10 V, equal to the output of the driver power supply 66. However, since the output voltage is limited to 5 V by the first step-down circuit 64, the voltage between the first gate electrode 18A and the first electrode 16A is 5 V. If a positive voltage is being applied to the second electrode 16B, the semiconductor element 10 is turned ON and a current flows, whereby the potential of the second electrode 16B decreases to the ON voltage. While the ON voltage is dictated by the ON-resistance and the conducted current of the semiconductor element 10, it is assumed herein to be 3 V, for example.

As the first control signal and the second control signal go to the high level, the output of the logic circuit 67 goes to the low level. Therefore, 0 V is applied to the gate of the semiconductor switch 68. Since the potential of the source of the semiconductor switch 68 is 10 V, the voltage of the gate with respect to the source is −10 V, being less than or equal to the threshold voltage, whereby the semiconductor switch 68 is turned ON. Since the voltage of the second electrode 16B has decreased to 3 V, being the ON voltage, a voltage of 7 V is applied across the capacitor 61 via the semiconductor switch 68 and the diode 69 and the capacitor 61 is charged.

Since the input terminal HIN is at the high level, the voltage between the output terminal HO and the second electrode 16B is 7 V, being the voltage between the bias power supply terminal VB and the offset terminal VS. Since the output voltage of the output terminal HO is stepped down to 5 V by the second step-down circuit 65, the voltage between the second gate electrode 18B and the second electrode 16B is 5 V. Therefore, the semiconductor element 10 reaches a conductive state where the current flows in both directions. The capacitor 61 remains charged at 7 V.

Then, when the first control signal and the second control signal go to the low level, the output of the logic circuit 67 goes to the high level, and 10 V is applied to the gate of the semiconductor switch 68. Therefore, the source-gate voltage of the semiconductor switch 68 becomes 0 V, and the semiconductor switch 68 is turned OFF.

In this state, if the potential of the second electrode 16B becomes a positive high potential (e.g., +100 V), a positive high voltage is applied to the control section 20. However, the diode 69 bears the high voltage, thus preventing the control section 20 from being broken. When the potential of the second electrode 16B becomes a negative high potential (e.g., −100 V), a negative high voltage is applied to the control section 20. However, since the semiconductor switch 68 is OFF, the semiconductor switch 68 bears the high voltage, thus preventing the control section 20 from being broken. Therefore, even if a positive or negative high voltage is applied while the semiconductor element 10 is OFF, the control section 20 is prevented from being broken by the high voltage.

The capacitor 61 can be charged again by turning ON the semiconductor element 10, and lowering the potential of the second electrode 16B to the ON voltage. If charging the capacitor 61 takes a long time or if a higher power is needed by the gate driving circuit, a capacitor of a larger capacitance may be used.

The delay circuit 67B between the output of the NAND circuit 67A and the gate of the semiconductor switch 68 is provided for turning ON the semiconductor switch 68 after the semiconductor element 10 is turned ON. Therefore, the delay time of the delay circuit 67B can be set to be longer than the amount of time required before the semiconductor element 10 is turned ON.

With the semiconductor device of the present embodiment, it is possible to eliminate the need for an insulated-type power supply for applying a bias voltage to the second gate electrode 18B. Therefore, it is possible to further reduce the sizes and the cost of the control section 20.

Note that in an HVIC for a commonly-used half-bridge circuit, the logic circuit provided therein prohibits the input signals to the terminal HIN and the terminal LIN from being at the high level at the same time. However, the HVIC used in the tenth and eleventh embodiments is such that the operation is allowed even if the terminal HIN and the terminal LIN are at the high level at the same time.

With the HVIC used in the present invention, the signal input to the terminal HIN is input to the high-side gate driving circuit 53B via the level shift circuit 53C. Therefore, the delay time from when the high-side gate driving circuit 53B receives the control signal until it outputs the gate voltage may possibly be longer than the delay time of the low-side gate driving circuit 53A. In such a case, a delay circuit may be provided at the input terminal LIN of the low-side gate driving circuit 53A so that the output of the low-side gate driving circuit 53A and the output of the high-side gate driving circuit 53B are synchronized with each other.

While the present embodiment is directed to an example where the gate driving circuit is an HVIC, it may be a gate driving circuit including a photocoupler. While the semiconductor switch 68 is a p-channel MOSFET herein, it may instead be a p-channel TORT or a PNP transistor.

Twelfth Embodiment

Figure 29:
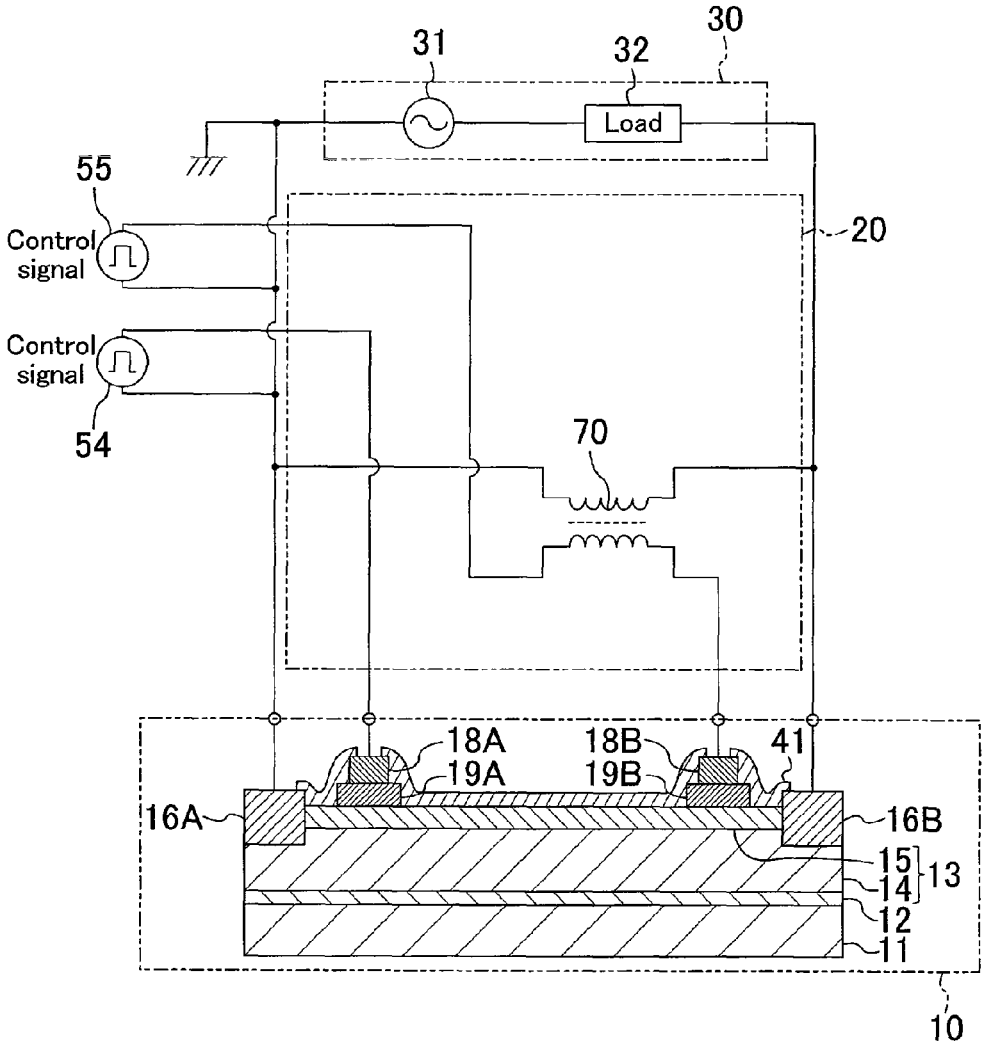
FIG. 29 A circuit diagram showing a semiconductor device according to a twelfth embodiment of the present invention.

A twelfth embodiment of the present invention will now be described with reference to the drawings. FIG. 29 shows a circuit configuration of a semiconductor device of the twelfth embodiment. In FIG. 29, like elements to those of FIG. 19 are denoted by like reference numerals and will not be further described below.

As shown in FIG. 29, in the semiconductor device of the present embodiment, the control section 20 includes a transformer 70, the first signal source 54 is connected between the first electrode 16A and the first gate electrode 18A, and the second signal source 55 is connected between the first electrode 16A and the second gate electrode 18B via the secondary side of the transformer 70. The primary side of the transformer 70 is connected between the first electrode 16A and the second electrode 16B. The transformer 70 is such that the ratio between the input voltage and the output voltage is 1:1, and the voltage input to the primary side and the voltage output to the secondary side are of the same phase at the frequency of a load circuit 30 used. The low level and the high level of the first control signal output from the first signal source 54 and the second control signal output from the second signal source 55 are 0 V and 5 V, respectively, for example.

In such a semiconductor device, when the load circuit 30 is outputting an AC signal of −100 V to +100 V, for example, an AC signal of −100V to +100V is input also to the primary side of the transformer 70. Therefore, an AC signal of −100 V to +100V having the same phase is output also on the secondary side of the transformer 70.

In such a state, if the second control signal is brought to 0 V, the voltage on the secondary side of the transformer 70 is equal to the voltage on the primary side. Therefore, if the potential of the second electrode 16B is −100 V, the potential of the second gate electrode 18B is also −100 V, and if the potential of the second electrode 16B is +100 V, the potential of the second gate electrode 18B is also +100 V. Thus, a voltage less than or equal to the second threshold voltage is constantly applied between the second gate electrode 18B and the second electrode 16B.

If the first control signal is brought to 0 V at the same time, the voltage between the first gate electrode 18A and the first electrode 16A also becomes 0 V, thus realizing a non-conductive state where no current flows in either direction. If the first control signal is brought to 5 V, a reverse-blocking state is realized where the current flows from the second electrode 16B to the first electrode 16A but not from the first electrode 16A to the second electrode 16B.

If the second control signal is brought to 5 V, the voltage on the secondary side of the transformer 70 becomes 5 V higher than the voltage on the primary side. Therefore, the voltage between the second gate electrode 18B and the second electrode 16B becomes 5 V, higher than the second threshold voltage. In such a state, if the first control signal is brought to 5 V, a conductive state is realized where the current flows in both directions between the first electrode 16A and the second electrode 16B. If the first control signal is brought to 0 V, a reverse-blocking state is realized where the current flows from the first electrode 16A to the second electrode 16B but not from the second electrode 16B to the first electrode 16A.

With the semiconductor device of the present embodiment, there is no need for a gate-driving power supply, whereby it is possible to simplify the control circuit and reduce the cost thereof.

In the present embodiment, the transformer 70 is such that the voltage input to the primary side and the voltage output to the secondary side are of the same phase at the frequency of the load circuit 30 used. However, with the provision of a phase compensation circuit on the secondary side, it is possible to use a transformer such that the voltages are not of the same phase. The phase compensation circuit may be any suitable circuit. For example, a capacitor having such a capacitance value that the secondary side and the primary side will be of the same phase may be connected between the secondary side of the transformer 70 and the second gate electrode 18B.

While the current is applied to the first gate electrode 18A and the second gate electrode 18B by the power of the first signal source 54 and the second signal source 55 in the present embodiment, a bias voltage may be applied to the first gate electrode 18A and the second gate electrode 18B via a gate driving circuit.

Thirteenth Embodiment

Figure 30:
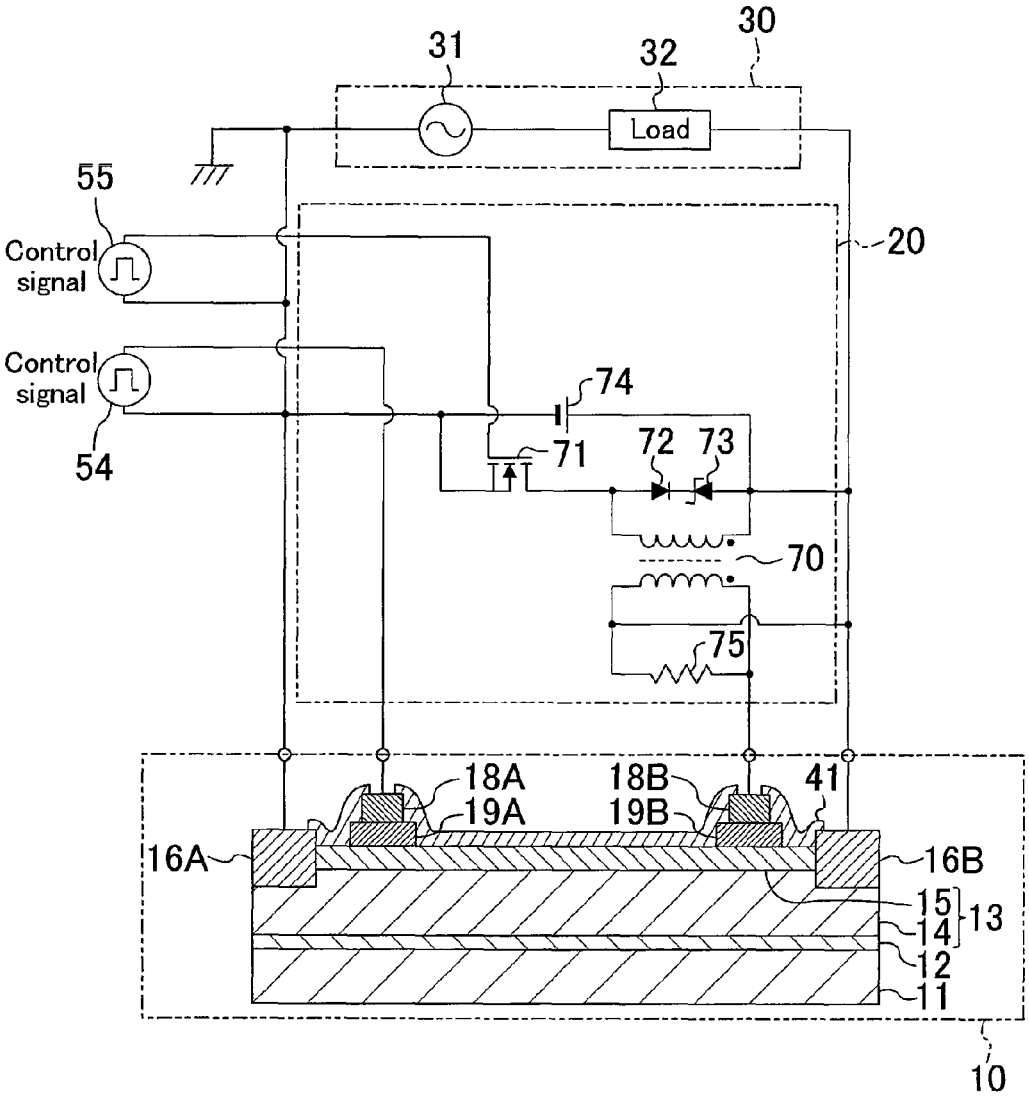
FIG. 30 A circuit diagram showing a semiconductor device according to a thirteenth embodiment of the present invention.

A thirteenth embodiment of the present invention will now be described with reference to the drawings. FIG. 30 shows a circuit configuration of a semiconductor device of the thirteenth embodiment. In FIG. 30, like elements to those of FIG. 19 are denoted by like reference numerals and will not be further described below.

As shown in FIG. 30, in the semiconductor device of the present embodiment, the control section 20 includes the transformer 70, an n-channel MOSFET 71, a diode 72, a Zener diode 73, and a first power supply 74.

The first signal source 54 is connected between the first electrode 16A and the first gate electrode 18A, and the second signal source 55 is connected between the gate terminal and the source terminal of the n-channel MOSFET 71. The source terminal of the n-channel MOSFET 71 is connected to the first electrode 16A, the anode of the first power supply 74 is connected to the first electrode 16A, and the cathode of the first power supply 74 is connected to one terminal of the primary side of the transformer 70. The other terminal of the primary side of the transformer 70 is connected to the drain terminal of the n-channel MOSFET 71. The diode 72 and the Zener diode 73 are connected in series between the opposite terminals of the primary side of the transformer 70. One terminal of the secondary side of the transformer is connected to the second electrode 16B, and the other terminal thereof is connected to the second gate electrode 18B. A resistor element 75 is connected between the opposite terminals of the secondary side of the transformer 70. The transformer 70 is such that the ratio between the input voltage and the output voltage is 1:1. The low level and the high level of the first control signal output from the first signal source 54 and the second control signal output from the second signal source 55 are 0 V and 5 V, respectively, for example.

ON/OFF of the n-channel MOSFET 71 is controlled by the second signal source 55. Therefore, the n-channel MOSFET 71 and the first power supply 74, connected to the primary side of the transformer 70, serve as a pulsed current generating section. When a pulsed current is input to the primary side of the transformer 70, a voltage is generated in the secondary side circuit of the transformer 70. As the generated voltage is received by the resistor element 75, an intended voltage is applied between the second electrode 16B and the second gate electrode 18B. With such a configuration, it is possible to eliminate the high-side insulated power supply and to thus reduce the total number of components, whereby it is possible to produce the control section 20 of the dual-gate semiconductor element 10 at a lower cost.

When the current flow to the primary side of the transformer 70 is turned ON/OFF, there occurs such a high voltage that the first power supply 74 and the n-channel MOSFET 71 are broken due to the inductance of the transformer 70. In order to absorb the voltage, a protection circuit is provided on the primary side of the transformer 70, in which the diode 72 and the Zener diode 73 are connected in series with each other in opposite polarity directions.

In the tenth to thirteenth embodiments, if the reverse-blocking state is not needed, there is needed only one control signal source. Also with the circuits of the eighth and ninth embodiments, a reverse-blocking state can be realized by providing two control signal sources.

While the tenth to thirteenth embodiments employ the dual-gate semiconductor element 10 of the fifth embodiment, those of the sixth and seventh embodiments may be used instead. Those of the normally-on type may be used instead of those of the normally-off type. In such a case, voltages applied to the first gate electrode and the second gate electrode may be changed to appropriate values according to the voltage of the first gate electrode and the threshold voltage of the second gate electrode. Moreover, the threshold voltage of the first gate electrode may be different from the threshold voltage of the second gate electrode.

Fourteenth Embodiment

Figure 31:
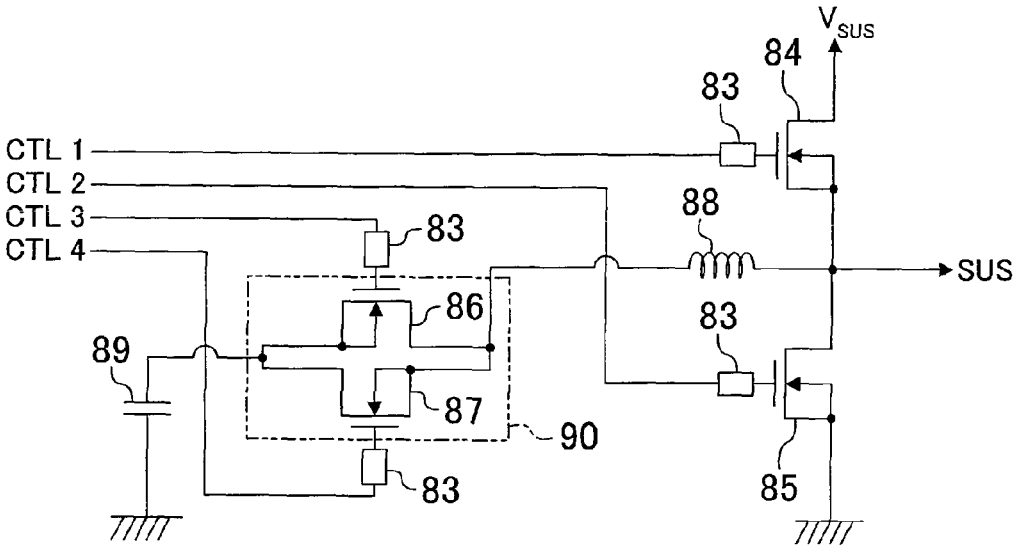
FIG. 31 A circuit diagram showing a sustain circuit according to a fourteenth embodiment of the present invention.

A fourteenth embodiment of the present invention will now be described with reference to the drawings. FIG. 31 shows a plasma display driving circuit using a nitride semiconductor device according to the fourteenth embodiment of the present invention. The plasma display driving circuit of the present embodiment is a sustain circuit for supplying a sustain pulse to the electrode of the plasma display panel, and has a configuration as follows.

One end of the output of a first switching element 84 is connected to the power supply line $V_{sus}$, and the other end thereof is connected to the output SUS of the sustain circuit. One end of the output of a second switching element 85 is connected to the output SUS of the sustain circuit, and the other end thereof is grounded. One end of the output of a third switching element 86 is connected to one end of a capacitor 89, and the other end of the capacitor 89 is grounded. The other end of the third switching element 86 is connected to one end of an inductor 88. A fourth switching element 87 is connected in parallel to the third switching element 86 with their conduction directions being opposite to each other. The third switching element 86 and the fourth switching element 87 together form a bidirectional switching circuit 90. The other end of the inductor 88 is connected to the output SUS of the sustain circuit. The gate terminals of the first switching element 84, the second switching element 85, the third switching element 86 and the fourth switching element 87 are connected to the control signal line CTL1, the control line CTL2, the control line CTL3 and the control line CTL4, respectively, via gate driving circuits R3

The bidirectional switching circuit 90 is provided for forming a path that carries a resonance current caused by the capacitor component of the electrode of the plasma display panel to which the output SUS is connected and the inductor 88. The sustain pulse is a large-current pulse alternating periodically. Therefore, switching elements of the bidirectional switching circuit 90 are required to have a high breakdown voltage in the positive direction and in the reverse direction and to be capable of a high-speed operation.

If semiconductor devices of the first embodiment as shown in FIG. 3 are used as the third switching element 86 and the fourth switching element 87 of the bidirectional switching circuit 90, for example, it is possible to easily realize a switch capable of controlling a large-current pulse in both directions. Since the semiconductor device of the first embodiment has sufficient reverse voltage characteristics, it is also possible to eliminate the need for a diode for improving the reverse voltage characteristics, which was necessary in the prior art.

Since the semiconductor device of the first embodiment has a small ON-resistance, it is possible to shorten the switching time and to reduce the power loss of the switching element, whereby there are substantially no junction temperature limitations. With the semiconductor device of the first embodiment, if a device isolation region is formed by implanting an impurity such as boron into the first nitride semiconductor layer and the second nitride semiconductor layer, it is possible to easily form two semiconductor devices on a single substrate. Thus, if the third switching element 86 and the fourth switching element 87 are put together into a single chip, it is possible to eliminate the problem of current concentration due to characteristics variations among the switching elements and the wire impedance difference, and it is possible to efficiently decrease the power capacity of the switching element.

The third switching element 86 and the fourth switching element 87 may be semiconductor elements illustrated in other embodiments. The bidirectional switching circuit 90 and the gate driving circuit 83 may be replaced by the bidirectional switch device illustrated in the fifth to thirteenth embodiments.

The first switching element 84 and the second switching element 85 may be semiconductor devices of the normally-off type using a nitride semiconductor in which the second control layer 19B is not provided.

While the various embodiments and variations thereof are directed to examples where the dual-gate semiconductor element is formed by using a nitride semiconductor, it may be any suitable semiconductor element in which electrons run in parallel to the principal plane of the substrate, and may be formed by using a semiconductor of silicon carbide (SiC), or the like. While Pd and Au are used as materials of the first gate electrode and the second gate electrode, Ni, or the like, may be used instead as long as an ohmic junction is formed with the p-type semiconductor. The substrate 11 may be, for example, GaN, sapphire, SiC, ZnO, GaAs, GaP, InP, $LiGaO_2$, $LiAlO_2$, or a mixed crystal thereof, instead of Si.

While the embodiments are directed to examples where the first electrode and the second electrode are ohmic electrodes forming an ohmic junction, they do not need to be ohmic electrodes as long as they allow the flow of the current to be controlled.

While the embodiments are directed to examples where the protection film is SiN, it is not limited to any particular material as long as the insulation is ensured, and may be aluminum nitride (AlN), silicon oxide ($SiO_2$), hafnium oxide ($HfO_2$), alumina ($Al_2O_3$), tantalum oxide ($Ta_2O_5$), or the like.

While the various embodiments and variations thereof are directed to examples with a semiconductor element in which the principal plane of the AlGaN layer or the GaN layer is the c plane ((0001) plane). However, it may not be the c plane, but may be a nonpolar plane containing the came number of nitrogen atoms and group III element atoms. For example, it may be formed on the A plane (11-20). With such a configuration, it is possible to eliminate carriers occurring due to polarization in the channel formed by the two-dimensional electron gas layer, and to increase the threshold voltage further in the positive direction, whereby it is possible to easily realize a normally-off operation without forming a depressed portion directly below the gate or thinning the AlGaN layer.

In any embodiment or variation thereof, the second semiconductor layer 15 may be undoped or n-type.

While the eighth to thirteenth embodiments are directed to cases where the first electrode is grounded, the first electrode may not be grounded.

In the eighth to thirteenth embodiments, the second power supply may be a battery, an insulated-type voltage converter (DC-DC converter), or the like, insulated from the potential of the first electrode. The first power supply may be a non-insulated-type power supply, and a less expensive non-insulated-type DC-DC converter, or the like, may be used.

The power supply for driving the HVIC in the tenth and eleventh embodiments may be a power supply that is shared with peripheral circuits.

While the eighth to eleventh embodiments use a load circuit being an AC power supply, there are no particular limitations thereto, and it may instead be a circuit capable of outputting a pulsed waveform, or the like.

While the eighth to thirteenth embodiments illustrate specific examples of the control section, control sections of other configurations may be used. In such a case, a second driver circuit for driving the second gate electrode may be a circuit capable of outputting a control signal with which the reference potential is different from the common reference potential of the circuit such as the ground potential.

In the various embodiments and variations thereof, the "protruding portions" and the "depressed portions" may have rounded corners.

INDUSTRIAL APPLICABILITY

With the present invention, it is possible to realize a semiconductor device which has excellent reverse voltage characteristics, which as a single element constitutes a bidirectional switch product, and which allows for the application of a high gate voltage, and a method for driving the same. Particularly, the present invention is useful as, for example, a semiconductor device capable of a bidirectional switching operation used for power control, and a method for driving the same.

The invention claimed is:

1. A semiconductor device, comprising:

a semiconductor layer stack of a nitride semiconductor or a silicon carbide semiconductor formed on a substrate and having a channel region;

a first electrode and a second electrode formed spaced apart from each other on the semiconductor layer stack; and a first gate electrode formed between the first electrode and the second electrode, and a second gate electrode formed between the first gate electrode and the second electrode, wherein:

a potential greater than a threshold voltage of the first gate electrode with reference to a potential of the first electrode is applied to the first gate electrode and a potential less than or equal to a threshold voltage of the second gate electrode with reference to a potential of the second electrode is applied to the second gate electrode, whereby the semiconductor device is brought to a reverse-blocking state in which a current flows from the second electrode to the first electrode but not from the first electrode to the second electrode; and a potential less than or equal to the threshold voltage of the first gate electrode with reference to the potential of the first electrode is applied to the first gate electrode and a potential less than or equal to the threshold voltage of the second gate electrode with reference to the potential of the second electrode is applied to the second gate electrode, whereby the semiconductor device is brought to a non-conductive state in which a current does not flow in either direction between the first electrode and the second electrode.

2. A semiconductor device, comprising:

a semiconductor layer stack of a nitride semiconductor or a silicon carbide semiconductor formed on a substrate and having a channel region;

a first electrode and a second electrode formed spaced apart from each other on the semiconductor layer stack; and a first gate electrode formed between the first electrode and the second electrode, and a second gate electrode formed between the first gate electrode and the second electrode, wherein:

a potential greater than the threshold voltage of the first gate electrode with reference to the potential of the first electrode is applied to the first gate electrode and a potential greater than the threshold voltage of the second gate electrode with reference to the potential of the second electrode is applied to the second gate electrode, whereby the semiconductor device is brought to a conductive state in which a current flows in both directions between the first electrode and the second electrode; and a potential less than or equal to the threshold voltage of the first gate electrode with reference to the potential of the first electrode is applied to the first gate electrode and a potential less than or equal to the threshold voltage of the second gate electrode with reference to the potential of the second electrode is applied to the second gate electrode, whereby the semiconductor device is brought to a non-conductive state in which a current does not flow in either direction between the first electrode and the second electrode.

3. The semiconductor device of claim 1, wherein a potential greater than the threshold voltage of the first gate electrode with reference to the potential of the first electrode is applied to the first gate electrode and a potential greater than the threshold voltage of the second gate electrode with reference to the potential of the second electrode is applied to the second gate electrode, whereby the semiconductor device is brought to a conductive state in which a current flows in both directions between the first electrode and the second electrode.

4. The semiconductor device of claim 1, further comprising a first control layer having a p-type conductivity formed between the semiconductor layer stack and the first gate electrode.

5. The semiconductor device of claim [1] *2* further comprising a first control layer having a p-type conductivity formed between the semiconductor layer stack and the first gate electrode.

6. The semiconductor device of claim 4, wherein the semiconductor device has a mode of operation in which a positive voltage with reference to the potential of the first electrode is applied to the first gate electrode to thereby inject holes into the channel region.

7. The semiconductor device of claim 5, wherein the semiconductor device has a mode of operation in which a positive voltage with reference to the potential of the first electrode is applied to the first gate electrode to thereby inject holes into the channel region.

8. The semiconductor device of claim 4, wherein the semiconductor device has a mode of operation in which a voltage greater than or equal to a built-in potential of a pn junction formed by the first control layer and the semiconductor layer stack is applied between the first gate electrode and the first electrode.

9. The semiconductor device of claim 5, wherein the semiconductor device has a mode of operation in which a voltage greater than or equal to a built-in potential of a pn junction formed by the first control layer and the semiconductor layer stack is applied between the first gate electrode and the first electrode.

10. The semiconductor device of claim 4, wherein a threshold voltage of the first gate electrode and that of the second gate electrode are different from each other.

11. The semiconductor device of claim 10, wherein the second gate electrode is in a Schottky junction with the semiconductor layer stack.

12. The semiconductor device of claim 11, wherein:

the semiconductor layer stack includes a depressed portion; and the second gate electrode is in contact with a bottom surface of the depressed portion.

13. The semiconductor device of claim 4, further comprising a second control layer having a p-type conductivity formed between the semiconductor layer stack and the second gate electrode.

14. The semiconductor device of claim 5, further comprising a second control layer having a p-type conductivity formed between the semiconductor layer stack and the second gate electrode.

15. The semiconductor device of claim 8, further comprising a second control layer having a p-type conductivity formed between the semiconductor layer stack and the second gate electrode, wherein the semiconductor device has a mode of operation in which a voltage greater than or equal to a built-in potential of a pn junction formed by the second control layer and the semiconductor layer stack is applied between the second gate electrode and the first electrode.

16. The semiconductor device of claim 9, further comprising a second control layer having a p-type conductivity formed between the semiconductor layer stack and the second gate electrode, wherein the semiconductor device has a mode of operation in which a voltage greater than or equal to a built-in potential of a pn junction formed by the second control layer and the semiconductor layer stack is applied between the second gate electrode and the first electrode.

17. The semiconductor device of claim 13, wherein:

an uppermost layer of the semiconductor layer stack includes a first portion, and a second portion having a thickness smaller than that of the first portion; and the first control layer and the second control layer are formed on the first portion.

18. The semiconductor device of claim 14, wherein:

an uppermost layer of the semiconductor layer stack includes a first portion, and a second portion having a thickness smaller than that of the first portion; and the first control layer and the second control layer are formed on the first portion.

19. The semiconductor device of claim 17, wherein:

an uppermost layer of the semiconductor layer stack includes a third portion having a thickness less than or equal to that of the second portion; and the first control layer and the second control layer is formed on the first portion and the third portion.

20. The semiconductor device of claim 18, wherein:

an uppermost layer of the semiconductor layer stack includes a third portion having a thickness less than or equal to that of the second portion; and the first control layer and the second control layer is formed on the first portion and the third portion.

21. The semiconductor device of claim 13, wherein:

the semiconductor layer stack includes a first semiconductor layer, a second semiconductor layer having a bandgap larger than that of the first semiconductor layer, and an etching absorbing layer, wherein the layers are formed in this order from bottom; and the etching absorbing layer is the uppermost layer of the semiconductor layer stack.

22. The semiconductor device of claim 14, wherein:

the semiconductor layer stack includes a first semiconductor layer, a second semiconductor layer having a bandgap larger than that of the first semiconductor layer, and an etching absorbing layer, wherein the layers are formed in this order from bottom; and the etching absorbing layer is the uppermost layer of the semiconductor layer stack.

23. The semiconductor device of claim 13, further comprising a high resistance layer formed on the semiconductor layer stack in a region between the first control layer and the second control layer, the high resistance layer having a resistance higher than that of the first control layer and the second control layer.

24. The semiconductor device of claim 23, wherein the high resistance layer is of a gallium oxide.

25. The semiconductor device of claim 22, wherein the high resistance layer is a layer containing boron.

26. The semiconductor device of claim 13, further comprising an undoped semiconductor layer formed on the semiconductor layer stack, wherein the first control layer and the second control layer are p-type impurity-diffused regions selectively formed in the undoped semiconductor layer.

27. The semiconductor device of claim 13, further comprising an oxide film layer having an opening formed on the semiconductor layer stack, wherein the first control layer and the second control layer are formed so as to be in contact with the semiconductor layer stack exposed through the opening.

28. The semiconductor device of claim 14, further comprising an undoped semiconductor layer formed on the semiconductor layer stack, wherein the first control layer and the second control layer are p-type impurity-diffused regions selectively formed in the undoped semiconductor layer.

29. The semiconductor device of claim 14, wherein further comprising an oxide film layer having an opening formed on the semiconductor layer stack, wherein the first control layer and the second control layer are formed so as to be in contact with the semiconductor layer stack exposed through the opening.

30. The semiconductor device of claim 8, wherein an interval between the first gate electrode and the second gate electrode is larger than that between the first electrode and the first gate electrode, and is larger than that between the second electrode and the second gate electrode.

31. The semiconductor device of claim 9, wherein an interval between the first gate electrode and the second gate electrode is larger than that between the first electrode and the first gate electrode, and is larger than that between the second electrode and the second gate electrode.

32. The semiconductor device of claim 11, wherein:

a threshold voltage of the second gate electrode of the semiconductor element is greater than or equal to 0 V; and the second electrode and the second gate electrode are electrically shorted with each other.

33. The semiconductor device of claim 12, wherein:

a threshold voltage of the second gate electrode of the semiconductor element is greater than or equal to 0 V; and the second electrode and the second gate electrode are electrically shorted with each other.

34. The semiconductor device of claim 13, wherein:

a threshold voltage of the second gate electrode of the semiconductor element is greater than or equal to 0 V; and the second electrode and the second gate electrode are electrically shorted with each other.

35. The semiconductor device of claim 8, wherein:

the semiconductor layer stack includes a first semiconductor layer and a second semiconductor layer which are layered in this order from a side of the substrate;

the second semiconductor layer has a bandgap larger than that of the first semiconductor layer; and the channel region is an interface region between the first semiconductor layer and the second semiconductor layer.

36. The semiconductor device of claim 35, wherein the first semiconductor layer and the second semiconductor layer contain at least one of gallium nitride and aluminum gallium nitride.

37. A semiconductor device, comprising:

*a substrate;* a semiconductor layer stack of a nitride semiconductor or a silicon carbide semiconductor [formed on a] *disposed above the* substrate [and], *the semiconductor layer stack* having a channel region;

a first electrode and a second electrode [formed] *disposed* spaced apart from each other on the semiconductor layer stack;

*a first gate electrode disposed between the first electrode and the second electrode;* a first [control] layer having a p-type conductivity [formed] *disposed* between the semiconductor layer stack and the first gate electrode; and a [third control] *second* layer having a p-type conductivity [formed] *disposed* between the semiconductor layer stack and the second electrode.

38. A bidirectional switch, comprising:

a semiconductor layer stack of a nitride semiconductor or a silicon carbide semiconductor formed on a substrate and having a channel region;

a first electrode and a second electrode formed spaced apart from each other on the semiconductor layer stack;

a first gate electrode formed between the first electrode and the second electrode, and a second gate electrode formed between the first gate electrode and the second electrode; and a control section for controlling a voltage applied to the first gate electrode and second gate electrode, wherein:

in a conductive state in which a current flows in both directions between the first electrode and the second electrode, the control section applies, to the first gate electrode, a voltage higher than a threshold voltage of the first gate electrode with reference to a potential of the first electrode, and applies, to the second gate electrode, a voltage higher than a threshold voltage of the second gate electrode with reference to a potential of the second electrode; and in a non-conductive state in which a current does not flow in either direction between the first electrode and the second electrode, the control section applies, to the first gate electrode, a voltage less than or equal to the threshold voltage of the first gate electrode with reference to the potential of the first electrode, and applies, to the second gate electrode, a voltage less than or equal to the threshold voltage of the second gate electrode with reference to the potential of the second electrode.

39. The bidirectional switch of claim 38, the control section including:

a first variable power supply for applying a voltage between the first electrode and the first gate electrode; and a second variable power supply for applying a voltage between the second electrode and the second gate electrode.

40. The bidirectional switch of claim 38, wherein:

the semiconductor element is of a normally-off type;

the control section includes:

a first power supply for applying a voltage higher than the threshold voltage of the first gate electrode between the first electrode and the first gate electrode;

a second power supply for applying a voltage higher than the threshold voltage of the second gate electrode between the second electrode and the second gate electrode;

a first gate driving circuit for connecting the first power supply between the first electrode and the first gate electrode in the conductive state, and electrically connecting the first electrode and the first gate electrode with each other in the non-conductive state; and a second gate driving circuit for connecting the second power supply between the second electrode and the second gate electrode in the conductive state, and electrically connecting the second electrode and the second gate electrode with each other in the non-conductive state.

41. The bidirectional switch of claim 40, wherein the second gate driving circuit includes a circuit for electrically insulating the second control signal from the potential of the second electrode.

42. The bidirectional switch of claim 41, wherein the circuit includes a photocoupler.

43. The bidirectional switch of claim 38, wherein:

the semiconductor element is of a normally-on type;

the control section includes:

a third power supply for applying a voltage less than or equal to the threshold voltage of the first gate electrode between the first electrode and the first gate electrode;

a fourth power supply for applying a voltage less than or equal to the threshold voltage of the second gate electrode between the second electrode and the second gate electrode;

a third gate driving circuit for electrically connecting the first electrode and the first gate electrode with each other in the conductive state, and connecting the third power supply between the first electrode and the first gate electrode in the non-conductive state; and a fourth gate driving circuit for electrically connecting the second electrode and the second gate electrode with each other in the conductive state, and connecting the third power supply between the fourth electrode and the second gate electrode in the non-conductive state.

44. The bidirectional switch of claim 38, wherein the control section includes:

a first power supply for applying a voltage higher than the threshold voltage of the first gate electrode between the first electrode and the first gate electrode;

a second power supply for applying a voltage higher than the threshold voltage of the second gate electrode between the second electrode and the second gate electrode;

a third power supply for applying a voltage less than or equal to the threshold voltage of the first gate electrode between the first electrode and the first gate electrode;

a fourth power supply for applying a voltage less than or equal to the threshold voltage of the second gate electrode between the second electrode and the second gate electrode;

a first gate driving circuit for connecting the first power supply between the first electrode and the first gate electrode in the conductive state, and connecting the third power supply between the first electrode and the first gate electrode in the non-conductive state; and a second gate driving circuit for connecting the second power supply between the second electrode and the second gate electrode in the conductive state, and connecting the fourth power supply between the second electrode and the second gate electrode in the non-conductive state.

45. The bidirectional switch of claim 38, wherein:

the control section includes:

a first gate driving circuit;

a second gate driving circuit;

a driver power supply;

a capacitor; and a charging circuit for charging the capacitor;

the charging circuit includes a charging switch circuit connected between the driver power supply and the capacitor and charging the capacitor by the driver power supply;

the first gate driving circuit connects the driver power supply between the first electrode and the first gate electrode in the conductive state, and connects the first electrode and the first gate electrode with each other in the non-conductive state; and the second gate driving circuit connects the capacitor between the second electrode and the second gate electrode in the conductive state, and connects the second electrode and the second gate electrode with each other in the non-conductive state.

46. The bidirectional switch of claim 45, wherein the charging switch circuit includes a semiconductor switch, and a diode connected in series with the semiconductor switch.

47. The bidirectional switch of claim 46, wherein the semiconductor switch is a p-channel MOSFET or a PNP transistor.

48. The bidirectional switch of claim 45, wherein the charging circuit charges the capacitor when a voltage between the second electrode and the first electrode is smaller than a driving voltage.

49. The bidirectional switch of claim 45, wherein the control section includes:

a first step-down circuit connected between the first gate driving circuit and the first gate electrode; and a second step-down circuit connected between the second gate driving circuit and the second gate electrode.

50. The bidirectional switch of claim 49, wherein the first step-down circuit and the second step-down circuit each include a resistor element and a Zener diode.

51. The bidirectional switch of claim 45, wherein the second gate driving circuit includes a circuit for electrically insulating the second control signal from the potential of the second electrode.

52. The bidirectional switch of claim 45, wherein the second gate driving circuit includes a photocoupler for electrically insulating the second control signal from the potential of the second electrode.

53. The bidirectional switch of claim 38, wherein:

the control section includes a transformer whose secondary side is connected to the second electrode and the second gate electrode; and a control signal for controlling the second gate electrode is input to a primary side of the transformer.

54. The bidirectional switch of claim 53, wherein:

the control section includes a pulsed current generating section connected to the primary side of the transformer for generating a pulsed current; and the second control signal is input to the transformer via the pulsed current generating section.

55. A method for driving a semiconductor device including a semiconductor element, the semiconductor element including a first electrode, a first gate electrode, a second gate electrode and a second electrode formed in this order while being spaced apart from one another on a semiconductor layer stack, which is formed on a substrate, the method comprising [the steps of]:

a step of applying a potential greater than a threshold voltage of the first gate electrode with reference to a potential of the first electrode to the first gate electrode and applying a potential less than or equal to a threshold voltage of the second gate electrode with reference to a potential of the second electrode to the second gate electrode, whereby the semiconductor device is brought to a reverse-blocking state in which a current flows from the second electrode to the first electrode but not from the first electrode to the second electrode; and a step of applying a potential less than or equal to the threshold voltage of the first gate electrode with reference to the potential of the first electrode to the first gate electrode and applying a potential less than or equal to the threshold voltage of the second gate electrode with reference to the potential of the second electrode to the second gate electrode, whereby the semiconductor device is brought to a non-conductive state in which a current does not flow in either direction between the first electrode and the second electrode.

56. A method for driving a semiconductor device including a semiconductor element, the semiconductor element including a first electrode, a first gate electrode, a second gate electrode and a second electrode formed in this order while being spaced apart from one another on a semiconductor layer stack, which is formed on a substrate, the method comprising [the steps of]:

a step of applying a potential greater than the threshold voltage of the first gate electrode with reference to the potential of the first electrode to the first gate electrode and applying a potential greater than the threshold voltage of the second gate electrode with reference to the potential of the second electrode to the second gate electrode, whereby the semiconductor device is brought to a conductive state in which a current flows in both directions between the first electrode and the second electrode; and a step of applying a potential less than or equal to the threshold voltage of the first gate electrode with reference to the potential of the first electrode to the first gate electrode and applying a potential less than or equal to the threshold voltage of the second gate electrode with reference to the potential of the second electrode to the second gate electrode, whereby the semiconductor device is brought to a non-conductive state in which a current does not flow in either direction between the first electrode and the second electrode.

57. The method for driving a semiconductor device of claim 55, further comprising a step of applying a potential greater than the threshold voltage of the first gate electrode with reference to the potential of the first electrode to the first gate electrode and applying a potential greater than the threshold voltage of the second gate electrode with reference to the potential of the second electrode to the second gate electrode, whereby the semiconductor device is brought to a conductive state in which a current flows in both directions between the first electrode and the second electrode.

*58. The semiconductor device of claim 37, wherein:*

*the second electrode includes a first side and a second side in a cross-sectional view, the first side being disposed between the first gate electrode and the second side,*

*the second layer includes a third side and a fourth side in the cross-sectional view, the third side being disposed between the first gate electrode and the fourth side, and*

*the third side is disposed between the first gate electrode and the first side.*

*59. The semiconductor device of claim 37, wherein:*

*the semiconductor layer stack includes a first region having a first thickness and a second region having a second thickness, the first thickness being greater than the second thickness,*

*the first layer and the second layer are disposed on the first region, and*

*at least a portion of the second region is disposed between the first layer and the second layer.*

*60. The semiconductor device of claim 59, wherein:*

*the semiconductor layer stack includes a third region having a third thickness, the third thickness being smaller than the second thickness, and*

*the first layer is disposed on the first region and the third region.*

*61. The semiconductor device of claim 60, wherein a threshold voltage of the first gate electrode is determined by a thickness of the semiconductor layer stack disposed in the third region.*

*62. A semiconductor device comprising:*

*a substrate;*

*a semiconductor layer stack of a nitride semiconductor or a silicon carbide semiconductor disposed above the substrate, the semiconductor layer stack having a channel region;*

*a first electrode disposed on the semiconductor layer stack;*

*a second electrode disposed on the semiconductor layer stack;*

*a first layer having a p-type conductivity, the first layer disposed on the semiconductor layer stack and disposed between the first electrode and the second electrode;*

*a second layer having a p-type conductivity, the second layer disposed on the semiconductor layer stack and disposed between the first layer and the second electrode;*

*a third electrode disposed on the first layer; and*

*a fourth electrode disposed on the second layer, wherein:*

*the semiconductor layer stack includes a first region having a first thickness and a second region having a second thickness, the first thickness being greater than the second thickness,*

*the first layer and the second layer are disposed on the first region, and*

*at least a portion of the second region is disposed between the first layer and the second layer.*

*63. The semiconductor device of claim 62, wherein the third electrode is electrically connected to the fourth electrode.*

*64. The semiconductor device of claim 63, wherein:*

*the fourth electrode includes a first side and a second side in a cross-sectional view, the first side being disposed between the third electrode and the second side,*

*the second layer includes a third side and a fourth side in the cross-sectional view, the third side being disposed between the third electrode and the fourth side, and*

*the third side is disposed between the third electrode and the first side.*

*65. The semiconductor device of claim 63, wherein:*

*the first electrode is a source electrode,*

*the second electrode is a drain electrode,*

*the third electrode is a gate electrode, and*

*the semiconductor device is a three-terminal device.*

*66. The semiconductor device of claim 62, wherein:*

*the third electrode has a first threshold voltage, and*

*the fourth electrode has a second threshold voltage different from the first threshold voltage.*

*67. The semiconductor device of claim 62, wherein:*

*the semiconductor layer stack includes a third region having a third thickness, the third thickness being smaller than the second thickness, and*

*the first layer is disposed on the first region and the third region.*

*68. The semiconductor device of claim 67, wherein a threshold voltage of the third electrode is determined by a thickness of the semiconductor layer stack disposed in the third region.*

*69. A semiconductor device comprising:*

*a substrate;*

*a semiconductor layer stack of a nitride semiconductor or a silicon carbide semiconductor disposed above the substrate, the semiconductor layer stack having a channel region;*

*a first electrode disposed on the semiconductor layer stack;*

*a second electrode disposed on the semiconductor layer stack;*

*a third electrode disposed on the semiconductor layer stack and disposed between the first electrode and the second electrode; and*

*a fourth electrode disposed on the semiconductor layer stack and disposed between the third electrode and the second electrode,*

*wherein the fourth electrode is electrically connected to the second electrode.*

*70. The semiconductor device of claim 69, wherein:*

*the first electrode is a source electrode,*

*the second electrode is a drain electrode,*

*the third electrode is a gate electrode, and*

*the semiconductor device is a three-terminal device.*

*71. The semiconductor device of claim 69, further comprising:*

*a layer having a p-type conductivity disposed on the semiconductor layer stack,*

*wherein the third electrode is disposed on the layer.*

*72. The semiconductor device of claim 69, further comprising:*

*a layer having a p-type conductivity disposed on the semiconductor layer stack,*

*wherein the fourth electrode is disposed on the layer.*

*73. The semiconductor device of claim 69, wherein:*

*the fourth electrode includes a first side and a second side in a cross-sectional view, the first side being disposed between the third electrode and the second side,*

*the second layer includes a third side and a fourth side in the cross-sectional view, the third side being disposed between the third electrode and the fourth side, and*

*the third side is disposed between the third electrode and the first side.*

*74. The semiconductor device of claim 69, wherein the fourth electrode forms a Schottky junction with the semiconductor layer stack.*

*75. The semiconductor device of claim 71, wherein:*

*the third electrode has a first threshold voltage, and*

*the fourth electrode has a second threshold voltage different from the first threshold voltage.*

*76. The semiconductor device of claim 72, wherein:*

*the third electrode has a first threshold voltage, and*

*the fourth electrode has a second threshold voltage different from the first threshold voltage.*

*77. A semiconductor device comprising:*

*a substrate;*

*a semiconductor layer stack of a nitride semiconductor or a silicon carbide semiconductor disposed above the substrate, the semiconductor layer stack having a channel region;*

*a first electrode disposed on the semiconductor layer stack;*

*a second electrode disposed on the semiconductor layer stack;*

*a third electrode disposed on the semiconductor layer stack and disposed between the first electrode and the second electrode;*

*a layer having a p-type conductivity, the layer disposed on the semiconductor layer stack and disposed between the third electrode and the second electrode; and*

*a fourth electrode disposed on the layer, wherein:*

*the layer forms a pn junction with the semiconductor layer stack, and*

*a voltage higher than a built-in voltage of the pn junction is applied to the fourth electrode.*

*78. The semiconductor device of claim 77, wherein the third electrode is electrically connected to the fourth electrode.*

*79. The semiconductor device of claim 78, wherein:*

*the fourth electrode includes a first side and a second side in a cross-sectional view, the first side being disposed between the third electrode and the second side,*

*the layer includes a third side and a fourth side in the cross-sectional view, the third side being disposed between the third electrode and the fourth side, and*

*the third side is disposed between the third electrode and the first side.*

*80. The semiconductor device of claim 77, wherein:*

*the third electrode has a first threshold voltage, and*

*the fourth electrode has a second threshold voltage different from the first threshold voltage.*

*81. The semiconductor device of claim 77, wherein:*

*the semiconductor layer stack includes a first region having a first thickness and a second region having a second thickness, the first thickness being greater than the second thickness,*

*the layer is disposed on the first region, and*

*at least a portion of the second region is disposed between the first gate electrode and the layer.*

*82. A semiconductor device, comprising:*

*a substrate;*

*a semiconductor layer stack of a nitride semiconductor or a silicon carbide semiconductor disposed above the substrate, the semiconductor layer stack having a channel region;*

*a first electrode and a second electrode disposed spaced apart from each other on the semiconductor layer stack;*

*a first gate electrode disposed on the semiconductor layer stack and disposed between the first electrode and the second electrode; and*

*a layer having a p-type conductivity and disposed between the semiconductor layer stack and the second electrode.*

*83. The semiconductor device of claim 82, wherein:*

*the second electrode includes a first side and a second side in a cross-sectional view, the first side being disposed between the first gate electrode and the second side,*

*the layer includes a third side and a fourth side in the cross-sectional view, the third side being disposed between the first gate electrode and the fourth side, and*

*the third side is disposed between the first gate electrode and the first side.*

*84. The semiconductor device of claim 82, wherein:*

*the semiconductor layer stack includes a first region having a first thickness and a second region having a second thickness, the first thickness being greater than the second thickness,*

*the layer is disposed on the first region, and*

*at least a portion of the second region is disposed between the first gate electrode and the layer.*

* * * * *